(12) United States Patent
Yamazaki et al.

(10) Patent No.: US 7,723,725 B2
(45) Date of Patent: *May 25, 2010

(54) SEMICONDUCTOR DEVICE AND METHOD OF FABRICATING THE SAME

(75) Inventors: Shunpei Yamazaki, Tokyo (JP); Satoshi Murakami, Kanagawa (JP); Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 163 days.

This patent is subject to a terminal disclaimer.

(21) Appl. No.: 11/649,315

(22) Filed: Jan. 3, 2007

(65) Prior Publication Data
US 2007/0164290 A1 Jul. 19, 2007

Related U.S. Application Data

(63) Continuation of application No. 10/651,458, filed on Aug. 29, 2003, now Pat. No. 7,161,176, which is a continuation of application No. 09/517,542, filed on Mar. 2, 2000, now Pat. No. 6,677,613.

(30) Foreign Application Priority Data
Mar. 3, 1999 (JP) .................................. 11-056286

(51) Int. Cl.
*H01L 31/00* (2006.01)
(52) U.S. Cl. .................... 257/59; 257/72; 257/E29.151
(58) Field of Classification Search .................... 257/72, 257/59, 71, E29.151
See application file for complete search history.

(56) References Cited

U.S. PATENT DOCUMENTS

| | | |
|---|---|---|
| 4,839,707 A | 6/1989 | Shields |
| 5,208,690 A | 5/1993 | Hayashi et al. |
| 5,463,483 A | 10/1995 | Yamazaki |
| 5,536,950 A * | 7/1996 | Liu et al. ...................... 257/59 |
| 5,594,569 A | 1/1997 | Konuma et al. |
| 5,612,565 A | 3/1997 | Kusumoto |
| 5,677,549 A | 10/1997 | Takayama et al. |
| 5,694,189 A | 12/1997 | Nakamura et al. |

(Continued)

OTHER PUBLICATIONS

Inui, S. et al, "Thresholdless Antiferroelectricity in Liquid Crystals and its Application to Displays," J. Matter Chem., vol. 6, No. 4, 1996, pp. 671-673.

(Continued)

*Primary Examiner*—Phat X Cao
(74) *Attorney, Agent, or Firm*—Husch Blackwell Sanders LLP

(57) ABSTRACT

There is provided an active matrix type display device in which the display device is formed of a driver circuit with an insulated gate FET capable of operating at high speed, and even if an area of a pixel electrode per unit pixel is made small, sufficient storage capacitance can be obtained. In a semiconductor device comprising an active matrix circuit with an insulated gate field effect transistor having at least an active layer made of single crystalline semiconductor, an organic resin insulating layer is formed over the insulated gate field effect transistor, a storage capacitance is formed of a light shielding layer formed over the organic resin insulating layer, a dielectric layer formed to be in close contact with the light shielding layer, and a light reflecting electrode connected to the insulated gate field effect transistor.

52 Claims, 16 Drawing Sheets

U.S. PATENT DOCUMENTS

| | | | |
|---|---|---|---|
| 5,702,963 | A | 12/1997 | Vu et al. |
| 5,733,661 | A | 3/1998 | Ue et al. |
| 5,815,223 | A | 9/1998 | Watanabe et al. |
| 5,856,689 | A | 1/1999 | Suzawa |
| 5,903,098 | A | 5/1999 | Jones |
| 5,904,514 | A | 5/1999 | Konuma et al. |
| 5,917,563 | A | 6/1999 | Matsushima |
| 5,929,474 | A | 7/1999 | Huang et al. |
| 5,982,002 | A | 11/1999 | Takasu et al. |
| 5,998,805 | A | 12/1999 | Shi et al. |
| 5,998,841 | A | 12/1999 | Suzawa |
| 6,002,462 | A | 12/1999 | Sato et al. |
| 6,046,547 | A * | 4/2000 | Nishio et al. ............. 315/169.3 |
| 6,064,076 | A * | 5/2000 | Chen et al. .................... 257/22 |
| 6,075,580 | A | 6/2000 | Kouchi |
| 6,084,579 | A | 7/2000 | Hirano |
| 6,096,582 | A | 8/2000 | Inoue et al. |
| 6,103,558 | A | 8/2000 | Yamanaka et al. |
| 6,114,715 | A * | 9/2000 | Hamada ...................... 257/72 |
| 6,127,279 | A | 10/2000 | Konuma |
| 6,147,451 | A | 11/2000 | Shibata et al. |
| 6,157,429 | A | 12/2000 | Miyawaki et al. |
| 6,162,654 | A | 12/2000 | Kawabe |
| 6,166,414 | A | 12/2000 | Miyazaki et al. |
| 6,172,728 | B1 | 1/2001 | Hiraishi et al. |
| 6,204,895 | B1 | 3/2001 | Nakamura et al. |
| 6,208,392 | B1 | 3/2001 | Miller et al. |
| 6,271,543 | B1 | 8/2001 | Ohtani et al. |
| 6,274,887 | B1 | 8/2001 | Yamazaki et al. |
| 6,278,131 | B1 | 8/2001 | Yamazaki et al. |
| 6,307,532 | B1 | 10/2001 | Aoki |
| 6,320,204 | B1 | 11/2001 | Hirabayashi et al. |
| 6,346,718 | B1 | 2/2002 | Yamanaka et al. |
| 6,351,010 | B1 | 2/2002 | Yamanaka et al. |
| 6,362,798 | B1 | 3/2002 | Kimura et al. |
| 6,366,025 | B1 | 4/2002 | Yamada |
| 6,372,558 | B1 | 4/2002 | Yamanaka et al. |
| 6,380,558 | B1 | 4/2002 | Yamazaki et al. |
| 6,380,687 | B1 | 4/2002 | Yamazaki |
| 6,518,594 | B1 | 2/2003 | Nakajima et al. |
| 6,518,962 | B2 | 2/2003 | Kimura et al. |
| 6,559,821 | B2 | 5/2003 | Ichikawa et al. |
| 6,576,924 | B1 | 6/2003 | Yamazaki et al. |
| 6,583,057 | B1 | 6/2003 | Alluri et al. |
| 6,617,644 | B1 | 9/2003 | Yamazaki et al. |
| 6,620,660 | B2 | 9/2003 | Ohtani et al. |
| 6,677,613 | B1 | 1/2004 | Yamazaki et al. |
| 6,737,800 | B1 | 5/2004 | Winters et al. |
| 6,781,155 | B1 | 8/2004 | Yamada |
| 6,831,623 | B2 | 12/2004 | Yasukawa |
| 6,836,067 | B1 | 12/2004 | Imai |
| 6,876,145 | B1 | 4/2005 | Yamazaki et al. |
| 7,161,176 | B2 * | 1/2007 | Yamazaki et al. ............. 257/59 |
| 2002/0066901 | A1 | 6/2002 | Yamanaka et al. |
| 2002/0149320 | A1 | 10/2002 | Maruyama et al. |
| 2003/0201439 | A1 | 10/2003 | Yamazaki et al. |
| 2005/0156173 | A1 | 7/2005 | Yamazaki et al. |

OTHER PUBLICATIONS

Yoshida, T. et al, "A Full-Color Thresholdless Antiferroelectric LCD Exhibiting Wide Viewing Angle with Fast Response Time," SID 97 Digest, 1997, pp. 841-844.

Sato, F. et al, "High Resolution and Bright LCD Projector with Reflective LCD Panels," SID 97 Digest, vol. 28, May 13-15, 1997, pp. 997-1000.

Furue, H. et al, "Characteristics and Driving Scheme of Polymer-Stabilized Monostable FLCD Exhibiting Fast Response Time and High Contrast Ratio with Gray-Scale Capability," SID 98 Digest, 1998, pp. 782-785.

Kurogane, H. et al, "Reflective AMLCD for Projection Displays: D-ILA," SID 98 Digest, vol. 29, May 17-22, 1998, pp. 33-36.

Nagata, T. et al, "Silicon-Chip-Based Reflective PDLC Light Valve for Projection Display," SID 98 Digest, vol. 29, May 17-22, 1998, pp. 37-40.

Dove, D.B., "High Performance Projection Displays Based on Reflective LC Silicon Light Valves," IDW '98, Dec. 7-9, 1998, pp. 741-744.

Hirota, S. et al, "A Silicon-Chip-Based Light Valve with Reflective Twisted Nematic Mode for High-Definition Projectors," IDW '99, Dec. 1-3, 1999, pp. 985-988.

Inui, S. et al, "Thresholdless Antiferroelectricity in Liquid Crystals and its Application to Displays," J. Mater Chem., (Journal of Materials Chemistry) vol. 6, No. 4, 1996, pp. 671-673.

* cited by examiner

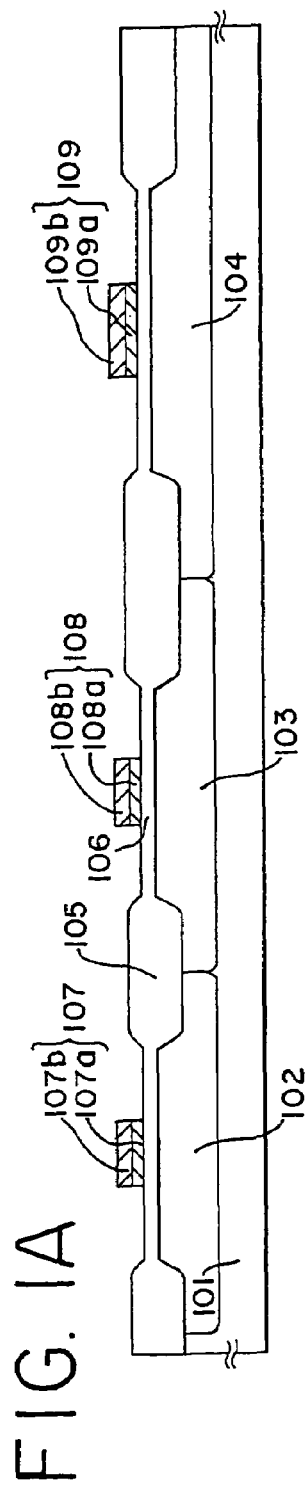
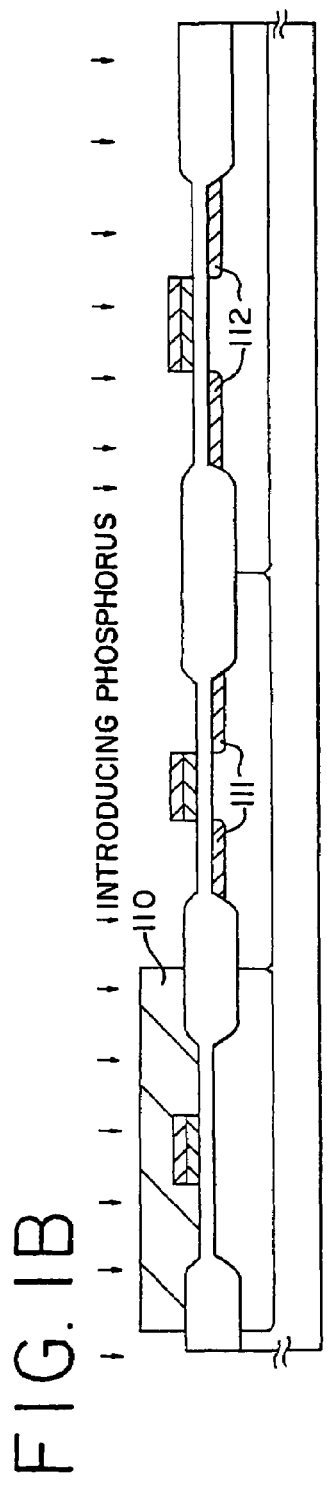
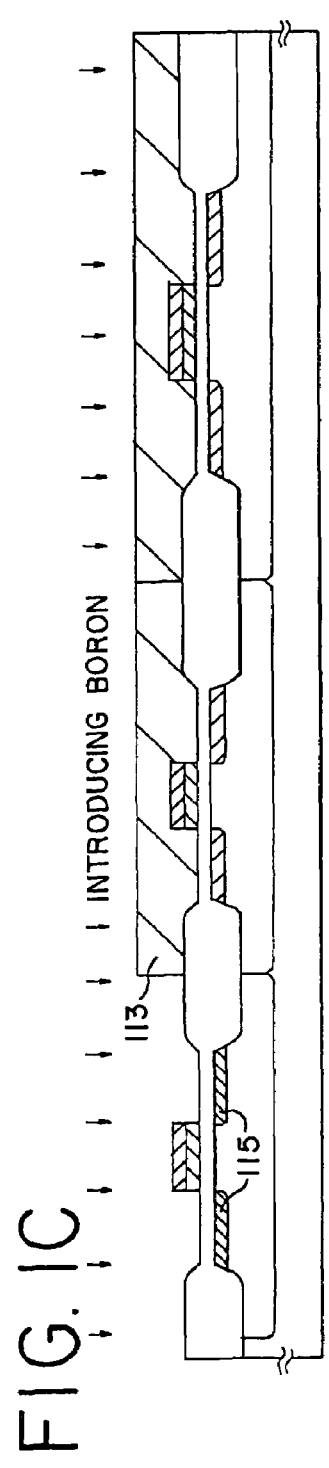

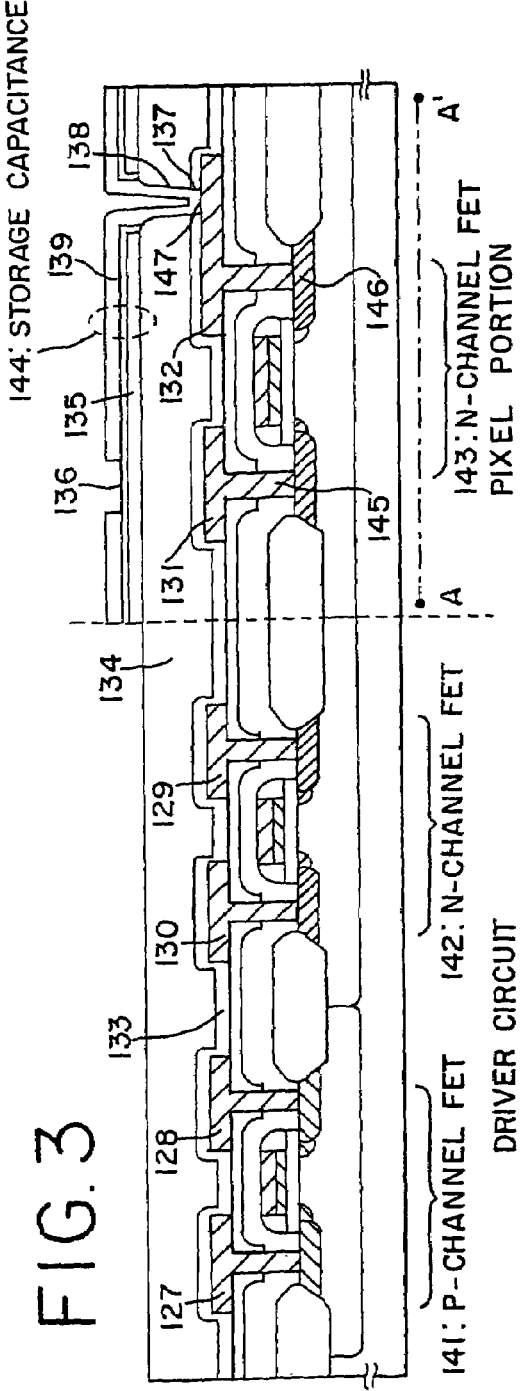

504 506 507 536 510 509 505
503 502 508
501: N-CHANNEL FET 515 516 517 537 522 518 521
514 513 520 519
512: N-CHANNEL FET 527 528 538 529 533
530 534
526 525 532 531
524: N-CHANNEL FET (X 40000)

(×40000)

$X = Xa - Xb \fallingdotseq 0$
$(Xa \fallingdotseq Xb)$

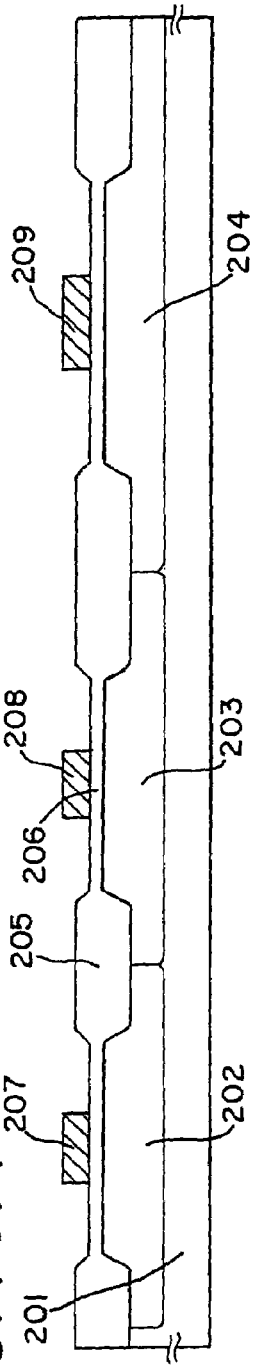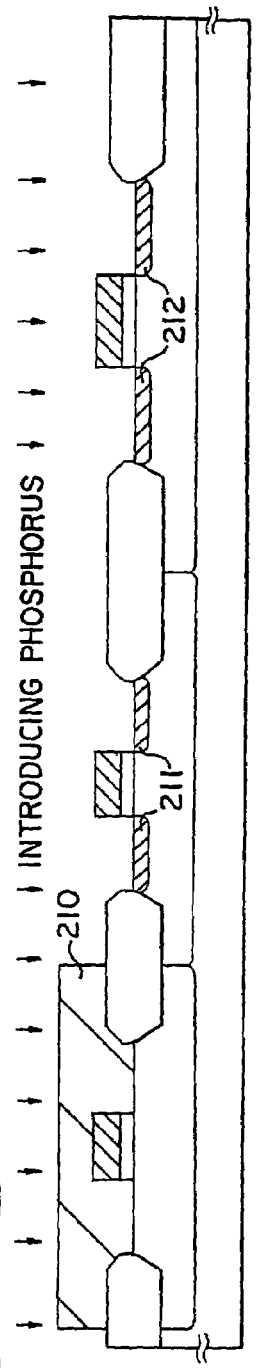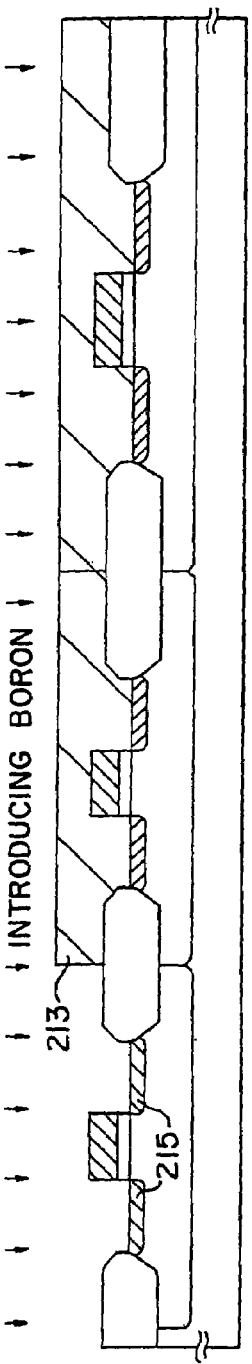

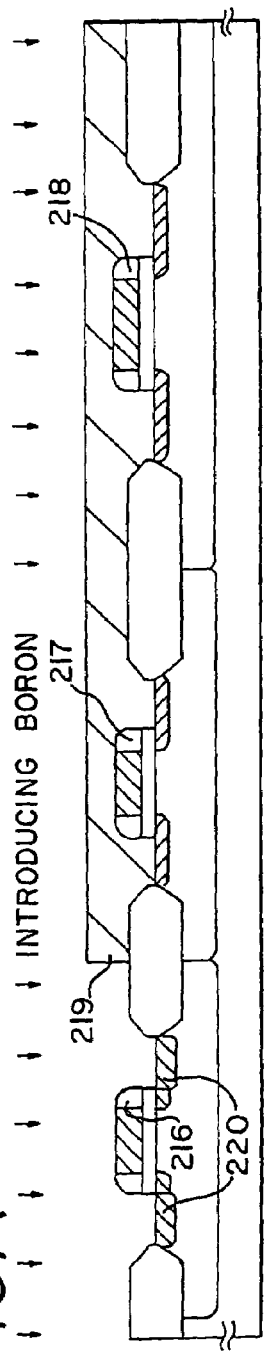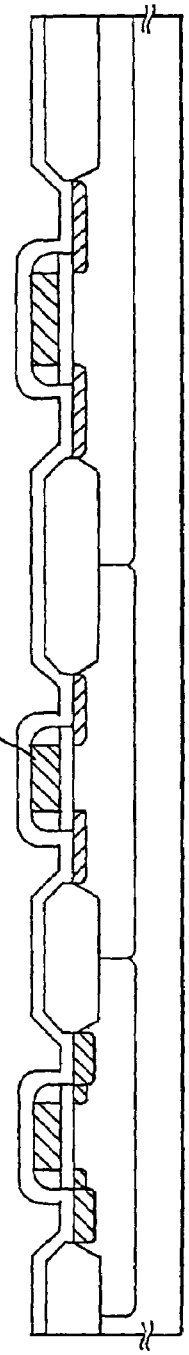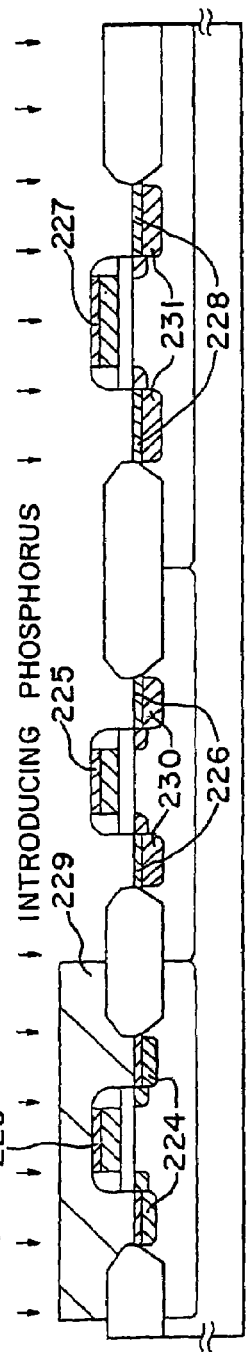

SEMICONDUCTOR DEVICE AND METHOD OF FABRICATING THE SAME

This application is a continuation of U.S. application Ser. No. 10/651,458, filed on Aug. 29, 2003 now U.S. Pat. No. 7,161,176 which is a continuation of U.S. application Ser. No. 09/517,542, filed on Mar. 2, 2000 (now U.S. Pat. No. 6,677,613 issued Jan. 13, 2004).

BACKGROUND OF THE INVENTION

1. Field of the Invention

The present invention relates to a semiconductor device including an integrated circuit with an insulated gate field effect transistor having an active layer made of single crystalline semiconductor, and a method of fabricating the same. Particularly, the present invention is suitable for use in an electro-optical device typified by a liquid crystal display device or electroluminescence (EL) display device in which a pixel portion (active matrix circuit) and a driver circuit connected to the pixel portion are provided on the same substrate, and an electronic equipment incorporating the electro-optical device. Incidentally, in the present specification, the term "semiconductor device" indicates any devices functioning by using semiconductor characteristics, and includes the foregoing electro-optical device and the electronic equipment incorporating the electro-optical device in its category.

2. Description of the Related Art

In a flat plate type display device (flat panel display) typified by a liquid crystal display device, an EL display device, or the like, there is known a technique for fabricating an active matrix type display device by using an insulated gate field effect transistor (hereinafter, a field effect transistor is referred to as an "FET") formed on a single crystalline semiconductor substrate. This is different from the case where a thin film transistor (hereinafter referred to as a "TFT") is formed on a glass substrate or quartz substrate and an active matrix type display device is fabricated, and it is possible to directly apply the technique developed in a large scale integrated circuit (LSI), and there has been a merit in that high performance FETs operating at high speed and driven by low voltage can be formed and integrated on a substrate to a high density. However; on the other hand, it has been considered that the technique has such defects that this is restricted to a reflection type or spontaneous light emitting type display device since the substrate is opaque to visible light, or a single crystalline semiconductor substrate is limited to a size supplied on the market.

However, in the technical direction, such as improvement of picture quality or full digitization, in a field of a display device, performance improvement required for the active matrix type display device has inevitably become high. In the active matrix type display device, such structure has been adopted that several tens to several million transistors (TET, FET, etc.) are arranged in a pixel portion for carrying out picture display, and a pixel electrode is connected to each of the transistors. Then, the device is constructed such that a voltage applied to each pixel is controlled by a switching function of the transistor to drive a liquid crystal or to cause an EL, component to emit light so that a picture is displayed. For example, in the case of a liquid crystal display device, an opposite electrode is provided at the side of an opposite substrate with an intervening liquid crystal, and a kind of capacitance (in the present specification, it is referred to as "liquid crystal capacitance") with the liquid crystal as a dielectric is formed. By controlling the electric charge stored in the liquid crystal capacitance, the liquid crystal is driven, and the amount of light transmitted through the liquid crystal is controlled to display a picture. However, since the capacity of this liquid crystal capacitance is gradually decreased by a leak current, the amount of transmitted light is changed and deterioration in the contrast of picture display has been caused. Then, it has been necessary to provide another capacitor (hereinafter referred to as a "storage capacitance") different from the liquid crystal capacitance for each pixel. This storage capacitance functions to compensate capacity which the liquid crystal capacitance has lost, and is provided to hold the electric charge in a period of one frame from writing to next writing. In an EL display device, such construction has been adopted that when a switching transistor provided for each pixel is turned on, a current flows to a current controlling transistor by a signal corresponding to picture data, and the EL component spontaneously emits light.

In such an active matrix type display device, it is expected that a digital system becomes the mainstream in order to realize further improvement in fineness and improvement in density of picture information in the future. For that purpose, it is necessary to newly provide a circuit necessary for processing digital signals, such as a Digital/Analog (D/A) converter or a latch circuit, and the structure of a driver circuit becomes complicated as compared with a conventional analog system, and it has been a problem to form a display device by a driver circuit with a transistor capable of operating at high speed. However, in a TFT formed on a glass substrate or quartz substrate, even if polycrystalline silicon is used for its active layer, an electron mobility to be obtainable is about 400 $cm^2/V \cdot sec$, which is about ⅓ of that of an FET fabricated by single crystalline silicon.

Further, when a pixel density is increased, an area of a pixel electrode per pixel becomes small, and the ratio of occupation by wirings and transistors inevitably becomes large, so that there has been a problem in that an aperture ratio is lowered. Besides, since an area where a storage capacitance can be formed becomes small as the area of the pixel electrode is reduced, there has been a problem in that it becomes difficult to form, with a limited area, a capacitance necessary for, driving a pixel portion.

SUMMARY OF THE INVENTION

The present invention has been made to solve the foregoing problems, and has an object to provide a display device driven by a driver circuit with an insulated gate type FET capable of operating at high speed, and further, to provide an active matrix type display device which can obtain a sufficient storage capacitance even if an area of a pixel electrode per unit pixel is made small. Another object is to provide an active matrix type liquid crystal display device having low consumed electric power and high reliability.

According to the structure of the present invention, in order to solve the above problems, there is provided a semiconductor device comprising a pixel portion with an insulated gate field effect transistor having at least an active layer made of single crystalline semiconductor, characterized in that an organic resin insulating layer is formed over the insulated gate field effect transistor, a storage capacitance is formed of a light shielding layer formed over the organic resin insulating layer, a dielectric layer formed to be in close contact with the light shielding layer, and a light reflecting electrode connected to the insulated gate field effect transistor.

According to the structure of the present invention, there is provided a semiconductor device comprising a pair of substrates and a liquid crystal interposed therebetween, characterized in that an insulated gate field effect transistor having at least an active layer made of single crystalline semiconductor; an organic resin insulating layer formed on the insulated gate field effect transistor, a storage capacitance is formed of a light shielding layer formed on the organic resin insulating layer, a dielectric layer formed to be in close contact with the light shielding layer, and a light reflecting electrode connected to the insulated gate field effect transistor are formed on one of the substrates, and at least a light transmitting conductive film is formed on the other of the substrates.

According to the structure of the present invention, there is provided a semiconductors device comprising an insulated gate field effect transistor having at least an active layer made of single crystalline semiconductor, and an organic EL component, characterized in that an organic resin insulating layer formed over the insulated gate field effect transistor, a storage capacitance is formed of a light shielding layer formed on the organic resin insulating layer, a dielectric layer formed to be in close contact with the light shielding layer, and a light reflecting electrode connected to the insulated gate field effect transistor.

It is preferable in the present invention that an insulating layer made of an inorganic compound is formed between the organic resin insulating layer and the light shielding layer, or an insulating layer made of an inorganic compound is formed on a surface of the organic resin insulating layer at a side where the light shielding layer is formed.

It is desirable in the present invention that the light shielding layer is made of at least one kind of material selected from aluminum, tantalum, and titanium, and the dielectric layer is an oxide of the material.

Further, according to the structure of the present invention, there is provided a method of fabricating a semiconductor device comprising a pixel portion with an insulated gate field effect transistor having at least an active layer, made of single crystalline semiconductor, characterized by comprising the steps of forming an organic resin layer over the insulated gate field effect transistor; forming a light shielding layer over the organic resin layer; forming a dielectric layer to be in close contact with the light shielding layer; and forming a light reflecting electrode including a region overlapping with the light shielding layer through the insulating layer.

According to the structure of the present invention, there is provided a method of fabricating a semiconductor device comprising a pair of substrates and a liquid crystal interposed therebetween, characterized by comprising the steps of: forming an insulated gate field effect transistor having at least an active layer made of single crystalline semiconductor over one of the substrates; forming an organic resin layer over the insulated gate field effect transistor; forming a light shielding layer over the organic resin layer; forming a dielectric layer to be in close contact with the light shielding layer; forming a light reflecting electrode connected to the insulated gate field effect transistor; and forming a light transmitting conductive film over the other of the substrates.

According to the structure of the present invention, there is provided a method of fabricating a semiconductor device comprising an insulated gate field effect transistor having at least an active layer made of single crystalline semiconductor, and an organic EL component, characterized by comprising the steps of: forming an organic resin layer over the insulated gate field effect transistor; forming a light shielding layer over the organic resin layer; forming a dielectric layer to be in close contact with the light shielding layer; and forming a light reflecting electrode connected to the insulated gate field effect transistor.

It is preferable in the present invention that an insulating layer made of an inorganic compound is formed between the organic resin insulating layer and the light shielding layer, or an insulating layer made of an inorganic compound is formed over a surface of the organic resin insulating layer at a side where the light shielding layer is formed.

It is desirable in the present invention that the light shielding layer is made of at least one kind of material selected from aluminum, tantalum, and titanium, and the dielectric layer is an oxide of the material Here, it is desirable that the dielectric layer is formed by an anodic oxidation method.

BRIEF DESCRIPTION OF THE DRAWINGS

In the accompanying drawings:

FIGS. 1A to 1C are sectional views showing fabricating steps of a pixel portion and a logic circuit;

FIG. 3 is a sectional view showing a fabricating step of the pixel portion and the logic circuit;

FIG. 4 is a sectional view of a pixel portion and a logic circuit;

FIGS. 18A to 18C are sectional views showing fabricating steps of a pixel portion and a logic circuit;

FIGS. 19A to 19C are sectional views showing fabricating steps of the pixel portion and the logic circuit;

DETAILED DESCRIPTION OF THE PREFERRED EMBODIMENT

Embodiment Mode 1

Figure 2A:
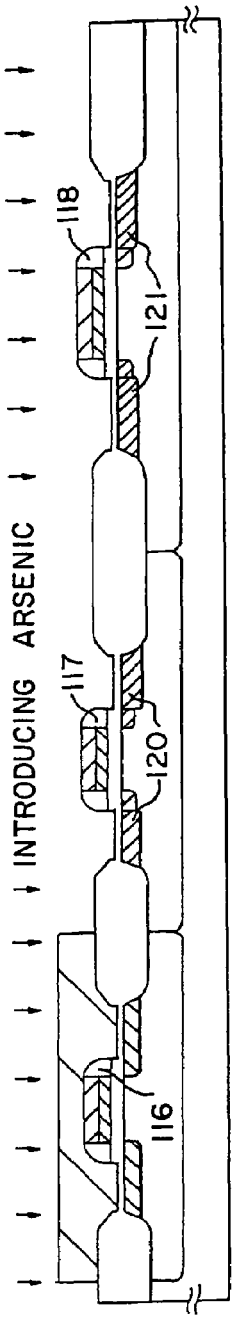
FIGS. 2A to 2C are sectional views showing fabricating steps of the pixel portion and the logic circuit.

An embodiment mode of the present invention will be described with reference to FIGS. 1A to 3. Here, a description will be made on an embodiment mode in which a pixel portion and a driver circuit provided at its periphery are provided on the same substrate.

In FIGS. 1A to 1C, a n-well region 102 and p-well regions 103 and 104 were formed in a substrate 101 made of single crystalline silicon having comparatively high resistance (for example, n type, about 10 Ωcm) by one mask in a self-aligning manner. Thereafter, a field oxide film 105 was formed. At this time, boron (B) may be selectively introduced into the substrate by an ion implantation method to form a channel stopper. Then, a silicon oxide film 106 which becomes a gate insulating film was formed by a thermal oxidation method. Subsequently, a polycrystalline silicon film for a gate electrode was formed to a thickness of 100 to 300 nm by a CVD method. The polycrystalline silicon film for the gate electrode may be previously doped with phosphorus (P) having a concentration of about $10^{21}/cm^3$ in order to lower the resistance, or dense n-type impurities may be diffused after the polycrystalline silicon film has been formed. Here, in order to further lower the resistance, a silicide film having a thickness of 50 to 300 nm was formed on this polycrystalline silicon film. As a silicide material, it is possible to use molybdenum silicide (MoSix), tungsten silicide (WSix), tantalum silicide (TaSix), titanium silicide (TiSix), or the like, and the material may be formed in accordance with a conventional methods. This polycrystalline silicon film and the silicide film were etched to form gate electrodes 107 to 109. The gate electrodes 107 to 109 have two-layer structure of polycrystalline silicon films 107a to 109a and silicide films 107b to 109b (FIG. 1A.

Next, in order to form a lightly doped drain (LDD) region in an n-channel FET and a p-channel FET, impurity elements which give an n-type and a p-type conductivity were added using resist masks 110 and 113 as masks. Here, phosphorus (P) was ion implanted to the n-channel FET and boron (B) was ion implanted to the p-channel FET. A dose amount was made $1 \times 10^{13}/cm^2$. Here, ion implantation was carried out using the gate electrodes as masks, so that regions 111 and 112 added with phosphorus (P) were formed in regions where the n-channel FETs were to be formed, and a region 115 added with boron (B) was formed in a region where the p-channel FET was to be formed in a self-aligning manner (FIGS. 1B and 1C).

Figure 2B:
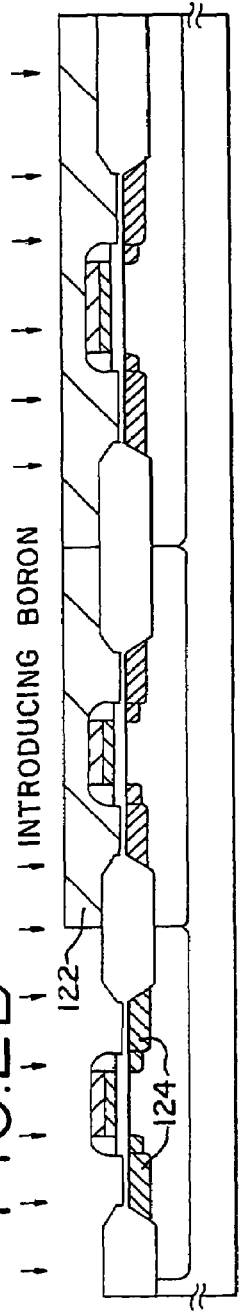

Thereafter; an insulating film such as a silicon oxide film or a silicon nitride film was formed on the whole surface by a CVD method, and when this film was uniformly etched over the whole surface by anisotropic dry etching, as shown in FIG. 2A, the insulating film remained at sides of the gate electrodes, and side walls 116 to 118 were formed. The side walls were used as masks, and arsenic having a dose amount of $5 \times 10^{15}/cm^2$ was ion implanted to the regions of the n-channel FETs, so that n-type impurity regions (source or drain regions) 120 and 121 were formed. Moreover; as shown in FIG. 2B, boron (B) was ion implanted to the region of the p-channel FET, so that a p-type impurity region (source or drain region) 124 was formed using a resist mask 122 as a mask.

Figure 2C:
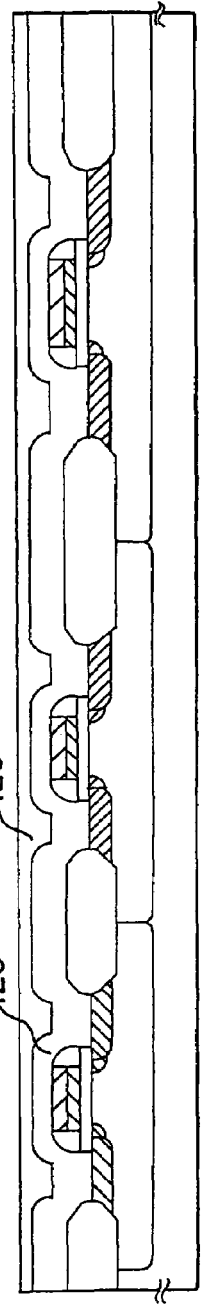

Then, the silicon oxide films remaining on the n-type impurity regions (source or drain regions) 120 and 121 and the p-type impurity region (source or drain region) 124 were removed by etching, and an interlayer insulating film 125 was formed on the whole surface. Further, a leveling film 126 of phosphorus glass (PSG), boron glass (BSG), or boron phosphorus glass (BPSG) was formed on top of the film 125. Thereafter, in order to activate the ion implanted impurity element, a heat treatment was carried out at 700 to 900° C. The leveling film 126 was subjected to reflow by this heat treatment, and the surface was further flattened (FIG. 2C).

Then, contact holes reaching the n-type impurity regions (source or drain regions) 120 and 121 and the p-type impurity region (source or drain region) 124 were formed in the interlayer insulating film 125 and the leveling film 126, and source wirings 127, 129, and 131 (connected to source region 145) and drain wirings 128, 130, and 132 (connected to drain region 146) were formed (FIG. 3). Although a material used for wiring is not limited, it is preferable that aluminum (Al) normally used as a low resistance material is used. Besides, a laminate structure of Al and titanium (Ti) may be used.

In this state, when a heat treatment at 300 to 500° C. preferably 350 to 450° C. was carried out in an atmosphere containing hydrogen, it was possible to bring characteristics of FETs into a more excellent state.

A passivation film 133 to be formed thereon was formed of a silicon nitride film, a silicon oxide film, or a silicon oxynitride film by a plasma CVD method. Moreover, an organic resin insulating film 134 was formed to a thickness of 1 to 2 μm. As the organic resin material, it was possible to use polyimide, polyamide, acryl, benzo-cyclo-butene (BCB) or the like. The advantages of using the organic resin film are such that a method of forming the film is simple, parasitic capacitance can be reduced since specific dielectric constant is low, and the film is suitable for flattening. Of course, an organic resin film other than the above may be used. Here, polyimide of a type that thermal polymerization was made after application to the substrate was used, and was formed through heating to 300° C. in a clean oven and burning.

Moreover, a light shielding film 135 was formed on this organic resin insulating film 134. The light shielding film 135 was formed of a film containing an element selected from aluminum (Al), titanium (Ti), and tantalum (Ta). In order to form a storage capacitance with the light shielding film as one electrode and pixel electrodes 139, which is connected to drain wiring 132 at a contact hole 147 through openings 137 and 138, as the other electrode in the pixel portion, a dielectric layer 136 was formed on the light shielding film 135. Although this dielectric layer can be formed using a silicon oxide film, a silicon nitride film, a silicon oxynitride film, a DLC (Diamond like carbon) film, or the foregoing polyimide film, each film being formed through deposition by a conventional film formation method, it is also possible to form the layer such that an oxide layer of the light shielding film is formed by using an anodic oxidation method and this is used as the dielectric layer 136.

In the anodic oxidation method, a voltage was applied in an electrolytic solution (for example, ethylene glycol solution containing 3 wt % of tartaric acid) while the light shielding film was used as an anode and platinum was used as a cathode, so that it was possible to form the dielectric layer which is dense and has no pinhole. Although the thickness of the dielectric layer, may be 10 to 100 nm for the purpose of forming the storage capacitance, preferably 20 to 70 nm, since the thickness of the light shielding film is decreased as the dielectric layer is formed, it is important to secure the thickness of the light shielding film in view of the decrease.

Table 1 shows a change in film thickness when an aluminum oxide film having a thickness of 50 nm was formed by anodic oxidation of a surface of an Al film, and a value of absorbance to light with a wavelength of 550 nm. The absorbance was measured by a spectrophotometer (made by Hitachi, Ltd., type U-4000).

TABLE 1

| Sample | Start thickness of Al film (nm) | Thickness of Al film after anodic oxidation (nm) | Thickness of Al oxide film (nm) | Total film thickness after anodic oxidation (nm) | Absorbance (at 550 nm) |
|---|---|---|---|---|---|
| A | 65 | 30 | 50 | 80 | 2.6 |
| B | 95 | 60 | 50 | 110 | 4.0 |
| C | 125 | 90 | 50 | 140 | 4.6 |

Figure 14:
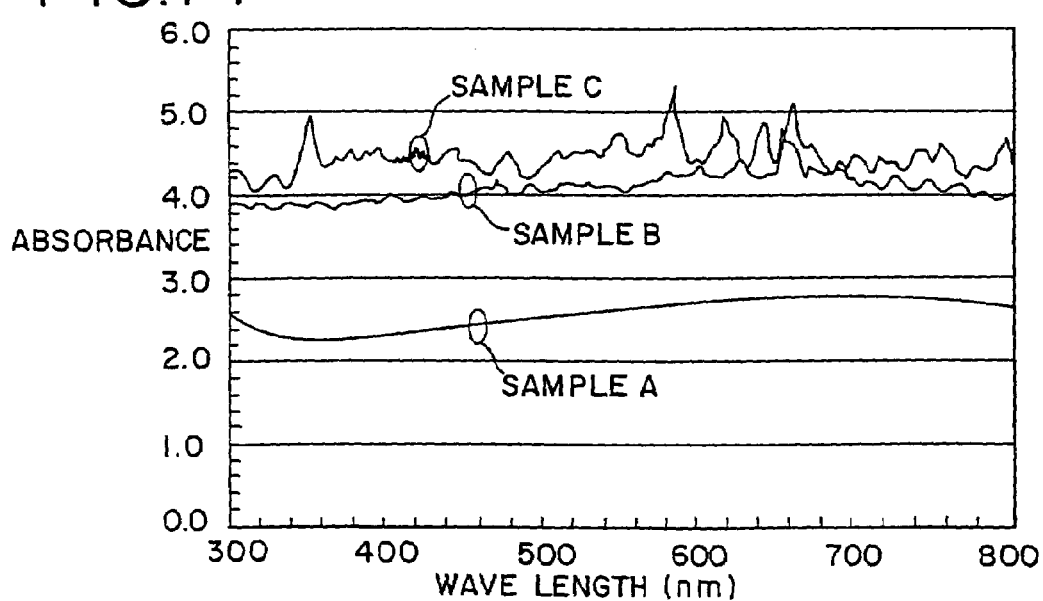
FIG. 14 is a view showing absorbance characteristics of light shielding films.

For example, when the initial thickness of the Al film was 65 nm, and the aluminum oxide film with a thickness of 50 nm was formed, although the total film thickness was increased to 80 nm, the thickness of the Al film was decreased to 30 nm. At this time, the absorbance to light of a wavelength of 550 nm was 2.6. In the samples of Table 1, characteristics of the absorbance to each wavelength are shown in FIG. 14. From the data of FIG. 14, it has become apparent that the absorbance depends on the thickness of the Al film in a wavelength range of between 300 and 600 nm. Consequently, from the result of FIG. 14 and visual observation, it was possible to judge that satisfactory characteristics were obtainable if the film thickness necessary as the light shielding film was made 60 nm or more, and the absorbance was made 3.0 or more.

Figure 13A:
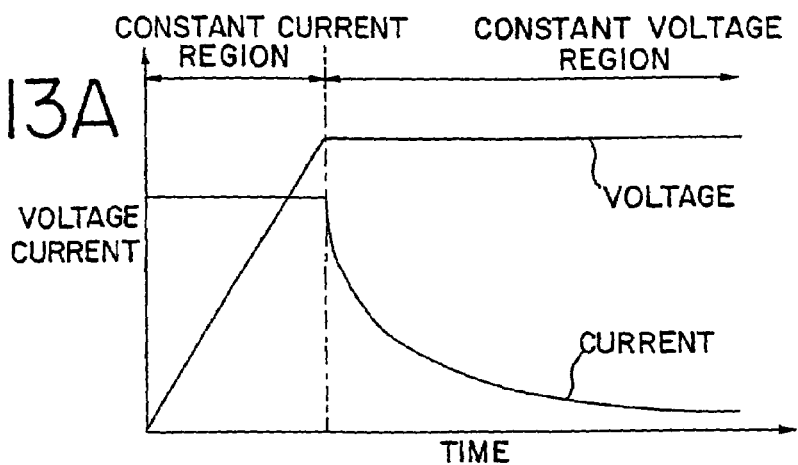
FIGS. 13A and 13B are control pattern views of forming voltage and forming current, each showing an anodic oxidation method.
Figure 13B:
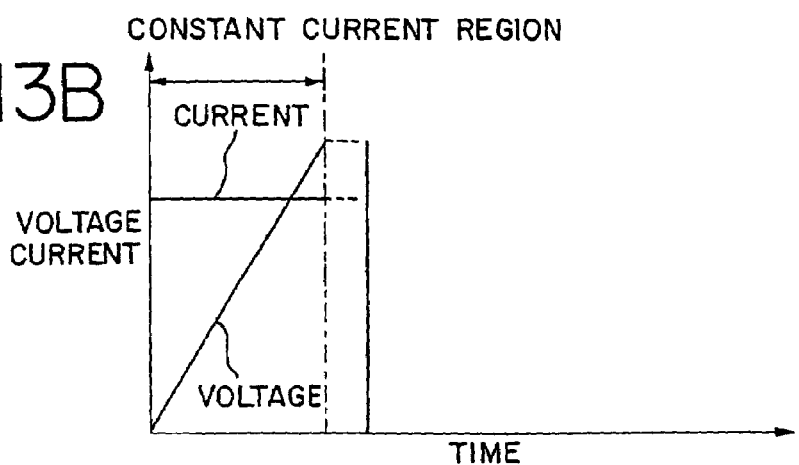

FIGS. 13A and 13B respectively show, in the anodic oxidation method, a control pattern of voltage (formation voltage) applied between an anode and a cathode, and current (formation current) flowing between the electrodes. In FIG. 13A, the formation current is first controlled to hold a constant value (constant current mode), and voltage is raised to a voltage value corresponding to a produced film thickness of a dielectric layer previously examined. After the voltage value reaches the predetermined value, the voltage value is held (constant voltage mode). When it was judged that the reaction of the anodic oxidation was ended when the current flowing between the electrodes became a certain set value or less, it was possible to form dielectric layers having comparable thicknesses with good reproducibility.

Figure 15A:
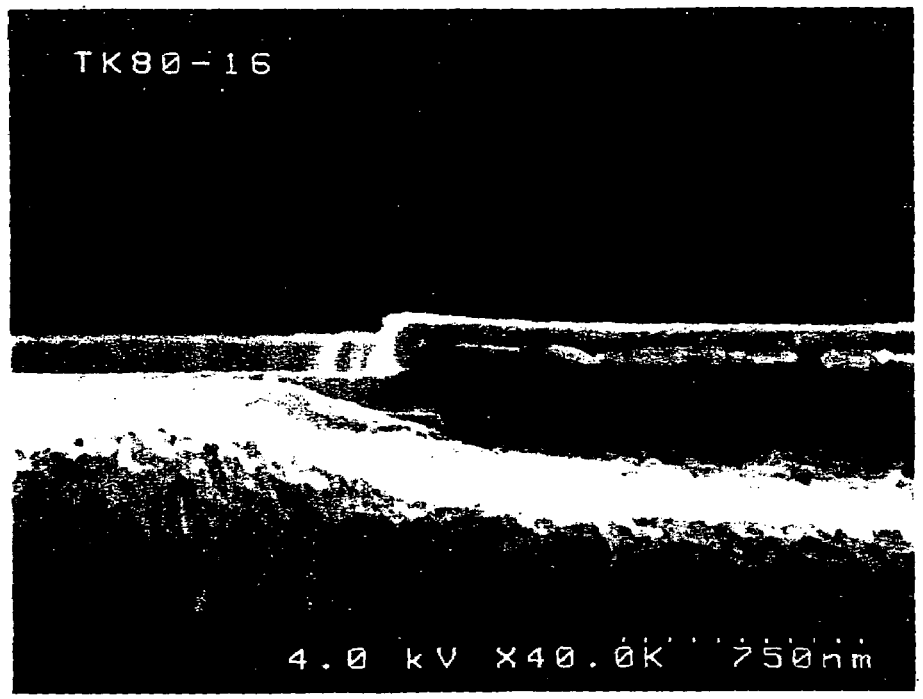
FIGS. 15A and 15B are a view showing a sectional SEM image when an Al film on an organic resin insulating layer has been subjected to an anodic oxidation treatment, and an enlarged schematic view of an electrode end.
Figure 15B:
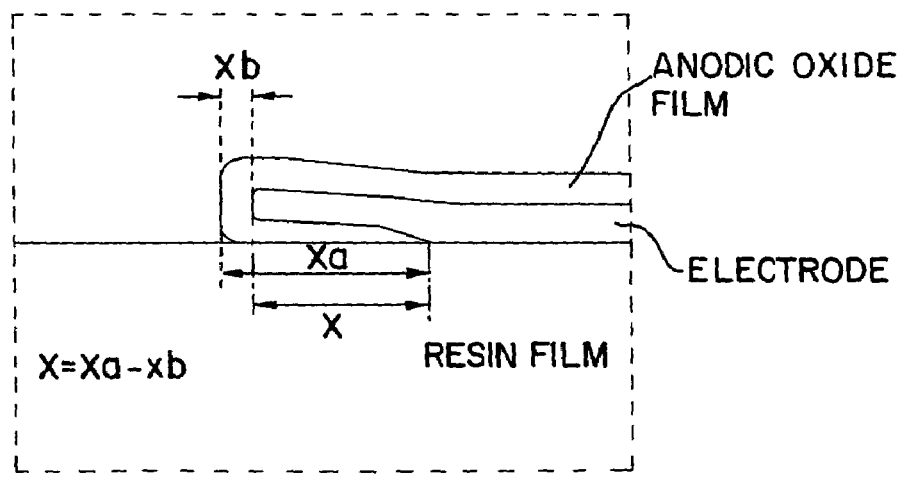

However, in the control pattern of FIG. 3A, in the case where the dielectric layer was formed on the surface of the light shielding film formed on the organic resin insulating film, the electrolytic solution soaked into the organic resin insulating film so that the film was expanded, and further, the electrolytic solution soaked also into the interface between the light shielding film and the organic resin insulating film, so that the dielectric layer was formed also at the side of the organic resin insulating film as the under layer over the length of several μm from the end of the light shielding film. An example of this state is shown in FIGS. 15A and 15B. FIG. 15A shows a result of observation, by a scanning electron microscope (SEM), of a sectional structure obtained when the Al film formed on the organic resin insulating film was subjected to the anodic oxidation treatment with the control pattern of FIG. 13A. FIG. 15B is a schematic view thereof. In the drawings, providing that the thickness of the dielectric at the end is Xb, and the length of the dielectric formed at the side of the organic resin insulating film as the under layer is Xa, a soaking amount X can be defined as a difference between Xa and Xb. According to the result of FIG. 15A, the soaking amount X was about 2 μm. As a result, the flatness of the light shielding film was damaged.

Figure 16A:
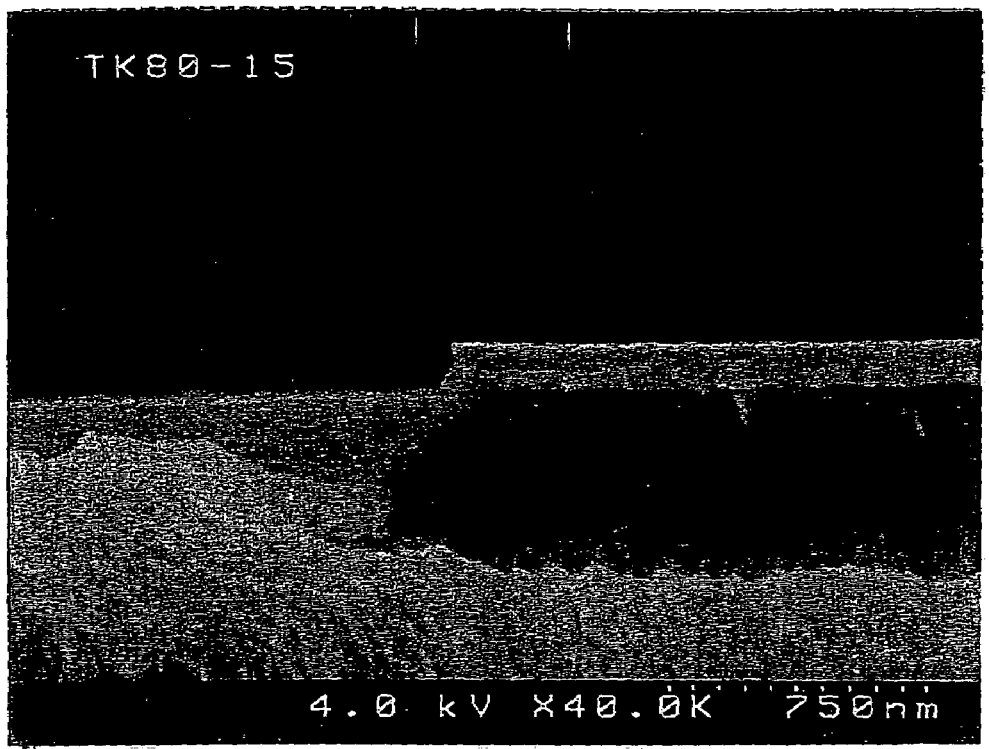
FIGS. 16A and 16B are a view showing a sectional SEM image when an Al film on an organic resin insulating layer has been subjected to an anodic oxidation treatment, and an enlarged schematic view of an electrode end.
Figure 16B:
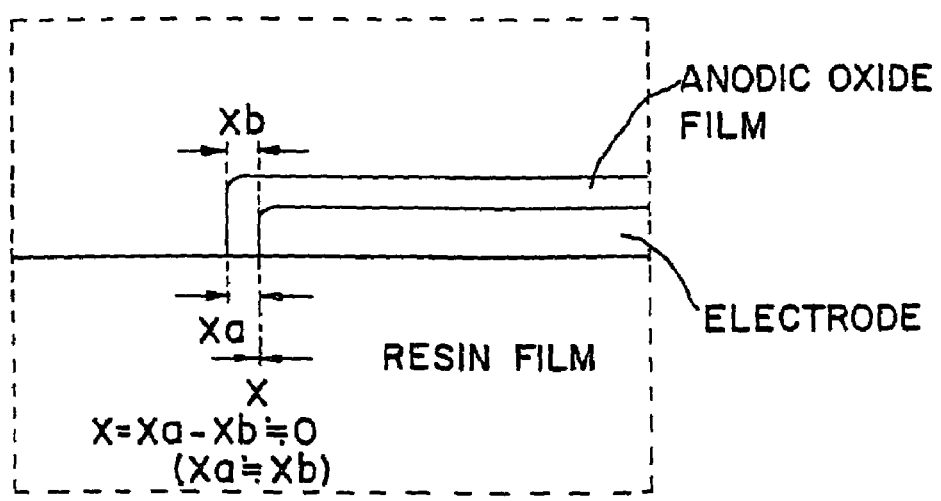

On the other hand, like the control pattern of formation voltage and formation current shown in FIG. 13B, as the constant current mode, the current density was raised 1.2 to 3 times as high as the condition of FIG. 13A, and after the voltage was rapidly raised in a short time up to a predetermined voltage corresponding to the film thickness of the dielectric layer to be formed on the surface of the light shielding film, the anodic oxidation was ended without holding the voltage or with the holding time made a very short time, so that it was possible to form the dielectric layer in which soaking did not occur on the organic resin insulating film. FIG. 16A is a SEM photograph of a light shielding film on an organic resin insulating film and a dielectric layer formed on the surface, which was fabricated by the foregoing method. It was possible to realize the excellent shape in which soaking from the end hardly occurred. FIG. 16B is a schematic view thereof. Even when the anodic oxidation was carried out with the control pattern as shown in FIG. 13B, it was possible to form the dielectric film which was dense, had no pinhole, and had high insulation withstand voltage.

Table 2 shows results of evaluation of soaking amounts from the ends of light shielding films when the films were formed under various anodic oxidation conditions. It was recognized that the soaking amount from the end relates to the rising time of voltage and holding time of voltages and it was possible to decrease the soaking amount by making the rising time of voltage shorter, and by shortening the constant voltage time to shorten the total anodic oxidation time.

TABLE 2

| | Voltage (V) | Current value (mA/sheet) | Rate of voltage rising (V/min) | Rising time (sec) | Constant voltage time (min) | Anodic oxidation time (sec) | Soaking amount (μm) |
|---|---|---|---|---|---|---|---|
| 1 | 35 | 1 | 0.5 to 0.6 | 3765 | 0 | 3765 | 1 to 2 |
| 2 | 35 | 20 | 13.8 | 122 | 0 | 122 | 0.5 |
| 3 | 35 | 100 | 87 to 430 | 7 | 0 | 7 | 0 to 0.05 |
| 4 | 35 | 20 | 13.8 | 128 | 15 | 328 | 0.625 |

Here, the pixel electrode 139 was formed, a part of which overlapped with the light shielding film through the dielectric layer fabricated by the anodic oxidation method with the control pattern shown in FIG. 13B. This pixel electrode 139 is connected to a drain wiring of an n-channel FET 143. The pixel electrode was made of a light reflective material typified by Al to form a reflection type display device.

Although Al can be easily formed by a conventional film formation method, for example, a vacuum evaporation method or sputtering method, in the case where the reflection type liquid crystal display device is formed, the surface of the pixel electrode may be roughened to form a diffusing reflection surface so as to improve the contrast.

In the manner described above, an active matrix substrate was fabricated in which a driver circuit including, as a base, a CMOS circuit composed of a p-channel FET 141 and an n-channel FET 142, and a pixel portion including the n-channel FET 143 and a storage capacitance 144 were formed on the same substrate. With respect to the driver circuit including the CMOS circuit as the base, for example, a shift register circuit, a buffer circuit, a sampling circuit, a D/A converter, a latch circuit, or the like can be formed by using the CMOS circuit as the base. When such a circuit was constructed by an insulated gate FET including an active layer made of single crystalline silicon, it was possible to perform high speed operation, and it was also possible to reduce the consumed electric power by making the driving voltage 3 to 5 V.

In the pixel portion like this, by forming the storage capacitance with the dielectric film formed to be in close contact with the surface of the light shielding film, even if the area of the pixel electrode per pixel was made small, it was possible to form sufficient capacitance. For example, even if the area of one pixel was made 400 μm$^2$, it was possible to form a capacitance of about 0.5 pF.

The structure of the transistor explained in this embodiment mode is merely one embodiment mode, and the present invention is not necessarily limited to the fabricating steps and the structure shown in FIGS. 1A to 3. The important point of the present invention is the structure of the FET formed on the single crystalline substrate and the storage capacitance formed thereon through the organic resin layer.

Embodiment Mode 2

As an SOI substrate in which a single crystalline silicon layer (SOI: Silicon On Insulators) is formed on an insulator, an active matrix substrate can be formed similarly to the embodiment mode 1. With respect to the SOI substrate, although some kinds are known according to the structure and fabricating method, typically, SIMOX (Separation by Implanted Oxygen), ELTRAN (Epitaxial Layer Transfer: registered trademark of Canon K.K.), Smart-Cut (registered trademark of SOITEC Inc.), or the like can be used. Of course, other SOI substrates can also be used.

FIG. 4 shows the structure fabricated by using such an SOI substrate. The fabricating method may be the same as the embodiment mode 1, and it is possible to form a driver circuit including a p-channel FET 438 and an n-channel FET 439 and a pixel portion including an n-channel FET 440 and a storage capacitance 441 on a substrate 401 through an insulating layer 402. The respective FETs are separated by a field insulating film 403.

The p-channel FET 438 of the driver circuit is provided with a gate electrode 407, a side wall 410, a gate insulating film 404, an LDD region 413, a source region 414, a drain region 415, a source wiring 424, and a drain wiring 425. The n-channel FET 439 is provided with a gate electrode 408, a side wall 411, a gate insulating film 405, an LDD region 416, a source region 417, a drain region 418, a source wiring 426, and a drain wiring 427. The n-channel FET 440 of the pixel portion is provided with a gate electrode 409, a side wall 412, a gate insulating film 406, an LDD region 419, a source region 420, a drain region 421, a source wiring 428, and a drain wiring 429.

An interlayer insulating film 422 is formed of a silicon oxide film, a silicon nitride film, a silicon oxynitride film, or the like, and a leveling film 423 made of PSG, BSG, or BPSG is formed thereon. A passivation film 430 is made of silicon nitride or silicon oxynitride, and is formed to cover the leveling film 423, the source wirings 424, 426, and 428, and the drain wirings 425, 427, and 429. An organic resin insulating film 431 is formed thereon, A light shielding film 432 was formed of a film containing an element selected from aluminum (Al), titanium (Ti), and tantalum (Ta) as its main ingredient. For the purpose of forming a storage capacitance using this light shielding film 432 as one electrode, a dielectric layer 433 having a thickness of 10 to 100 nm, preferably 20 to 70 nm was formed on the light shielding film. As the dielectric layer, it is desirable to use a dielectric layer formed on the surface of the light shielding film by using the anodic oxidation methods. A pixel electrode 436 connected to the drain wiring 429 of the n-channel FET 440 through openings 434 and 435 was formed on the light shielding film 432 through the insulating film 433. Here, in order to form a reflection type display device, the electrode was formed of a light reflective material typified by Al.

In the manner as described above, on the SOI substrate, it was possible to form the driver circuit including, as the base, the CMOS circuit composed of the p-channel transistor 438 and the n-channel transistor 439, and the pixel portion including the n-channel transistor 440 and the storage capacitance 441 on the same substrate. With respect to the driver circuit including the CMOS circuit as the base, for example, a shift register circuit, a buffer circuit, a sampling circuit, a D/A converter, a latch circuit, or the like can be formed by using the CMOS circuit as the base.

Embodiment Mode 3

Figure 5A:
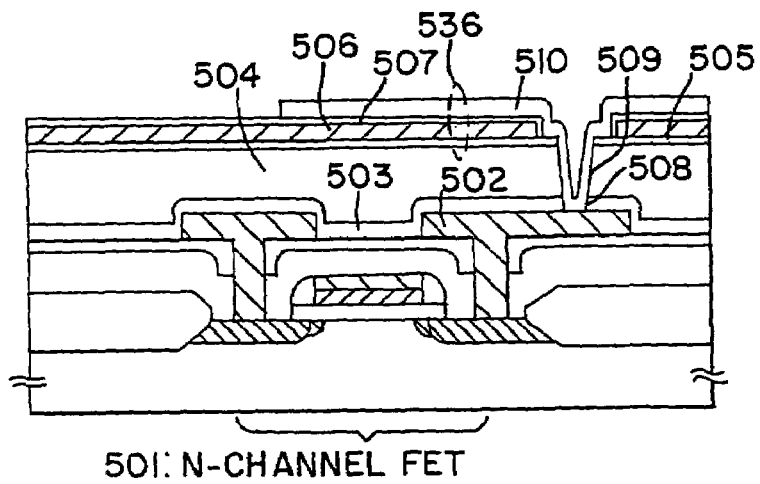
FIGS. 5A to 5C are sectional views respectively explaining the structure of a storage capacitance.
Figure 5B:
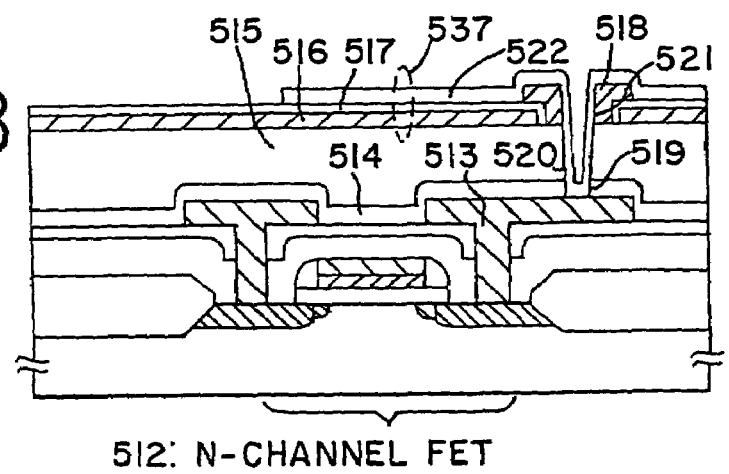
Figure 5C:
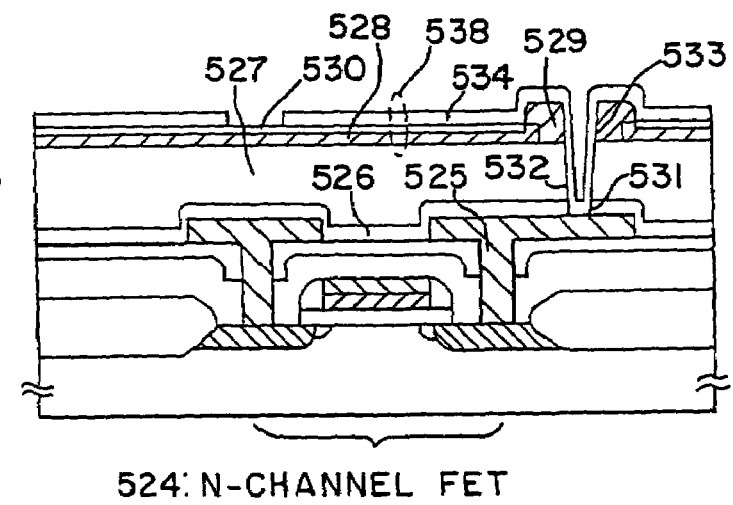

FIGS. 5A to 5C show other structural examples of connection methods of a storage capacitance provided in a pixel portion. FIGS. 5A to 5C respectively show a sectional structure of the pixel portion fabricated in the same manner, as the embodiment mode 1. In FIG. 5A, a passivation film 503 and an interlayer insulating film 504 made of organic resin are formed on an n-channel FET 501, and a film 505 made of inorganic material is formed thereon. This film may be formed by using a silicon oxide film, a silicon nitride film, a silicon oxynitride film, or the like, and may be preferably formed by a sputtering method or vacuum evaporation method. A light shielding film 506 is formed thereon, and adhesion to an under layer is improved, so that even if a dielectric layer 507 is formed by the anodic oxidation method, soaking of an electrolytic solution does not occur, and an excellent shape can be formed. By forming a pixel electrode 510 connected to a drain electrode 502 through openings 508 and 509 provided in the passivation film 503 and the organic resin insulating film 504, a storage capacitance 536 is formed in the region where the pixel electrode 510 overlaps with the light shielding film 506.

In FIG. 5B, a storage capacitance 537 connected to an n-channel FET 512 is constituted by a light shielding film 516 formed on an organic resin insulating film 515, a dielectric layer 517 formed thereon by the anodic oxidation method, and a pixel electrode 522. A spacer 518 of insulator is provided in a region where an opening of the organic resin insulating film 515 is formed, and the pixel electrode 522 is connected to a drain wiring 513 through an opening 519 provided in the passivation film 514, an opening 520 provided in the organic resin insulating film 515, and an opening 521 provided in the spacer 518. By providing the spacer 518 like this, a short circuit occurring between the light shielding film and the pixel electrode can be prevented without fail. The storage capacitance 537 is formed in the region where the light shielding film 516, the dielectric layer 517, and the pixel electrode 522 overlap with one another.

FIG. 5C shows another structure of a storage capacitance 538 connected to an n-channel FET 524. A light shielding film 528 and a spacer 529 made of organic resin are formed on an organic resin insulating film 527. A dielectric layer 530 is formed on the surface of the light shielding film 528 by the anodic oxidation method. A pixel electrode 534 is connected to a drain wiring 525 through an opening 531 provided in a passivation film 526, an opening 532 provided in the organic resin insulating film 527, and an opening 533 provided in the spacer 529. The storage capacitance 538 is formed in the region where the light shielding film 528, the dielectric layer 530, and the pixel electrodes 534, 535 overlap with one another. By making such structure, it is possible to form an anodic oxidation film without soaking even on the organic resin film.

Next, preferred embodiments of the present invention will be described in detail.

Embodiment 1

Figure 6:
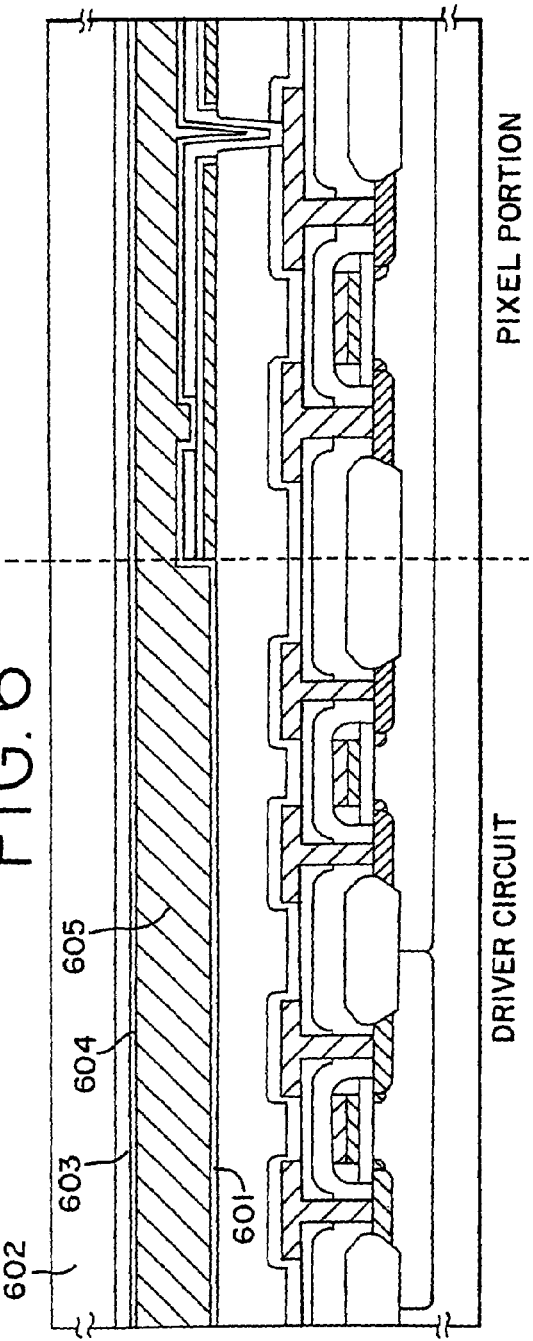
FIG. 6 is a sectional view of an active matrix type liquid crystal display device.

In this embodiment, steps of fabricating an active matrix type liquid crystal display device from an active matrix substrate fabricated in the embodiment mode 1 will be described. As shown in FIG. 6, an alignment film 601 is formed to the substrate of the state of FIG. 3. Normally, polyimide resin is often used for an alignment film of a liquid crystal display device. A transparent conductive film 603 and an alignment film 604 were formed on an opposite side substrate 602. After the alignment film was formed, a rubbing treatment was carried out so that liquid crystal molecules were oriented in parallel with a specific pie-tilt angle. The active matrix substrate in which the pixel portion and the CMOS circuit were formed, and the opposite substrate were bonded to each other by a conventional cell assembling step through a sealing material, a spacer (neither of them is shown), or the like. Thereafter, a liquid crystal material 605 was injected between both the substrates, and complete sealing was made by a sealing agent (not shown).

In the liquid crystal display device fabricated in the above embodiment, other than a TN (Twisted Nematic) liquid crystal, various liquid crystals may be used. For example, it is possible to use a liquid crystal disclosed in 1998 SID, "Characteristics and Driving Scheme of Polymer-Stabilized Monostable FLCD Exhibiting Fast Response Time and High Contrast Ratio with Gray-Scale Capability" by H. Furue et al; 1997, SID DIGEST, 841, "A Full-Color Thresholdless Antiferroelectric LCD Exhibiting Wide Viewing Angle with Fast Response Time" by T. Yoshida et al; 1996, J. Mater. Chem. 6(4), 671-67.3, "Thresholdless antiferroelectricity in liquid crystals and its application to displays" by S. Inui et al; or U.S. Pat. No. 5,594,569.

A liquid crystal exhibiting antiferroelectricity in some temperature range is called an antiferroelectric liquid crystal. In mixed liquid crystals including antiferroelectric liquid crystals, there is a thresholdless antiferroelectric mixed liquid crystal exhibiting electro-optical response characteristics in which transmittance is continuously changed with respect to an electric field. Some thresholdless antiferroelectric mixed liquid crystal exhibits V-shaped electro-optical response characteristics, and a liquid crystal in which its driving voltage is about ±2.5 V (cell thickness is about 1 to 2 μm) has also been found.

Figure 12:
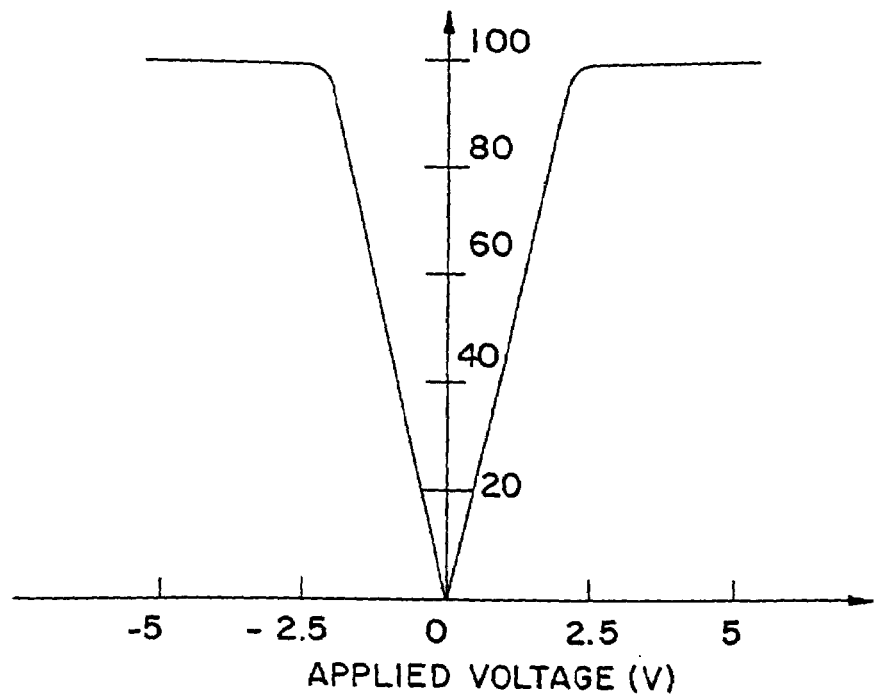
FIG. 12 is a view showing characteristics between applied voltage and transmissivity in thresholdless antiferroelectric mixed liquid crystal.

Here, FIG. 12 shows an example of characteristics of light transmittance of the thresholdless antiferroelectric mixed liquid crystal showing the V-shaped electro-optical response to applied voltage. The vertical axis of the graph shown in FIG. 12 indicates the transmissivity (in arbitrary unit) and the horizontal axis indicates the applied voltage. Incidentally, the transmission axis of a polarizing plate of a liquid crystal display device at an incident side is set almost parallel to a normal direction of a smectic layer of the thresholdless antiferroelectric mixed liquid crystal which is almost coincident with the rubbing direction of the liquid crystal display device. The transmission axis of the polarizing plate at an outgoing side is set almost normal (crossed Nicols) to the transmission axis of the polarizing plate at the incident side.

As shown in FIG. 12, it is understood that when such a thresholdless antiferroelectric mixed liquid crystal is used, low voltage driving and gradation display become possible.

In the case where such a low voltage driving thresholdless antiferroelectric mixed liquid crystal is used for a liquid crystal display device having an analog driver, it becomes possible to suppress the power supply voltage of a sampling circuit of an image signal to, for example, about 5 to 8V. Thus, the operation power supply voltage of the driver can be lowered, and low power consumption and high reliability of the liquid crystal display device can be realized.

Also in the case where such a low voltage driving thresholdless antiferroelectric mixed liquid crystal is used for a liquid crystal display device having a digital driver, an output voltage of a D/A conversion circuit can be lowered, so that the operation power supply voltage of the D/A conversion circuit can be lowered and the operation power supply voltage of the driver can be made low. Thus, low power consumption and high reliability of the liquid crystal display device can be realized.

Thus, to use such a low voltage driving thresholdless antiferroelectric mixed liquid crystal is effective also in the case where a TFT having an LDD region (lightly doped drain region) with a relatively small width (for example, 0 to 500 nm or 0 to 200 nm) is used.

Besides, in general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large storage capacitance for a pixel. Thus, it is preferable to use the thresholdless antiferroelectric mixed liquid crystal having small spontaneous polarization. Besides, it is also permissible to design such that a driving method of the liquid crystal display device is made linear sequential driving, so that a writing period (pixel feed period) of a gradation voltage to a pixel is prolonged and small storage capacitance is compensated.

Since low voltage driving can be realized by using such a thresholdless antiferroelectric mixed liquid crystal, low power consumption can be realized when the liquid crystal display device is formed by the active matrix substrate of the present invention.

Incidentally, as long as a liquid crystal has electro-optical characteristics as shown in FIG. 12, any liquid crystal can be used as a display medium of a liquid crystal display device of the present invention.

Figure 7:
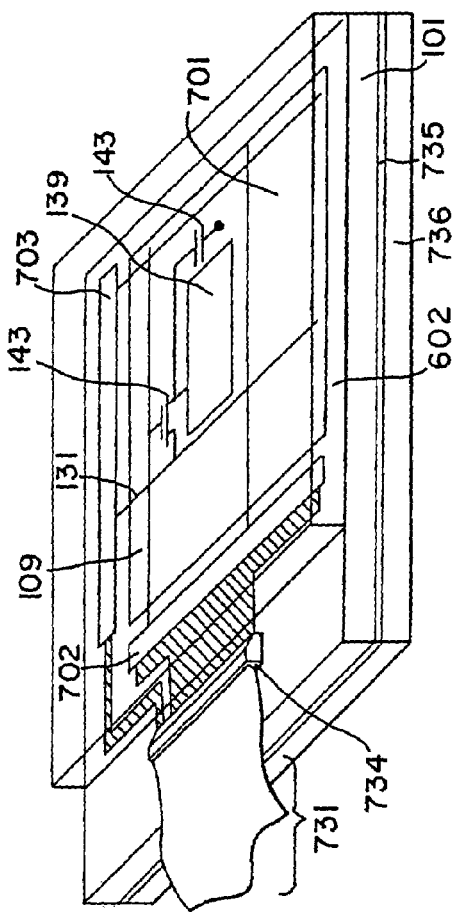
FIG. 7 is a perspective view of an active matrix type liquid crystal display device.

Next, the structure of this active matrix type liquid crystal display device will be described with reference to a perspective view of FIG. 7 and a top view of FIG. 8. Incidentally, in order to establish the correspondence with the sectional structural views of FIGS. 1A to 3 and FIG. 6, common reference numerals to the foregoing drawings are used in FIGS. 7 and 8. An active matrix substrate is constituted by a pixel portion 701, a scanning (gate) line driver circuit 702, and a signal (source) line driver circuit 703 formed on a substrate 101. An n-channel transistor 143 of the pixel portion, and the driver circuits provided on the periphery are respectively constructed by a CMOS circuit as a base. The scanning (gate) line driver circuit 702 and the signal (source) line driver circuit 703 are respectively connected to the pixel portion 701 through a gate wiring 109 and a source wirings wiring 131. An FPC 731 is connected to an external input/output terminal 734. The substrate 101 is fixed to a base plate 736 through a resin layer 735, so that the mechanical strength is held, and further, the base plate 736 is made of a material having excellent thermal conductivity, so that a heat radiation effect can also be obtained.

Figure 8:
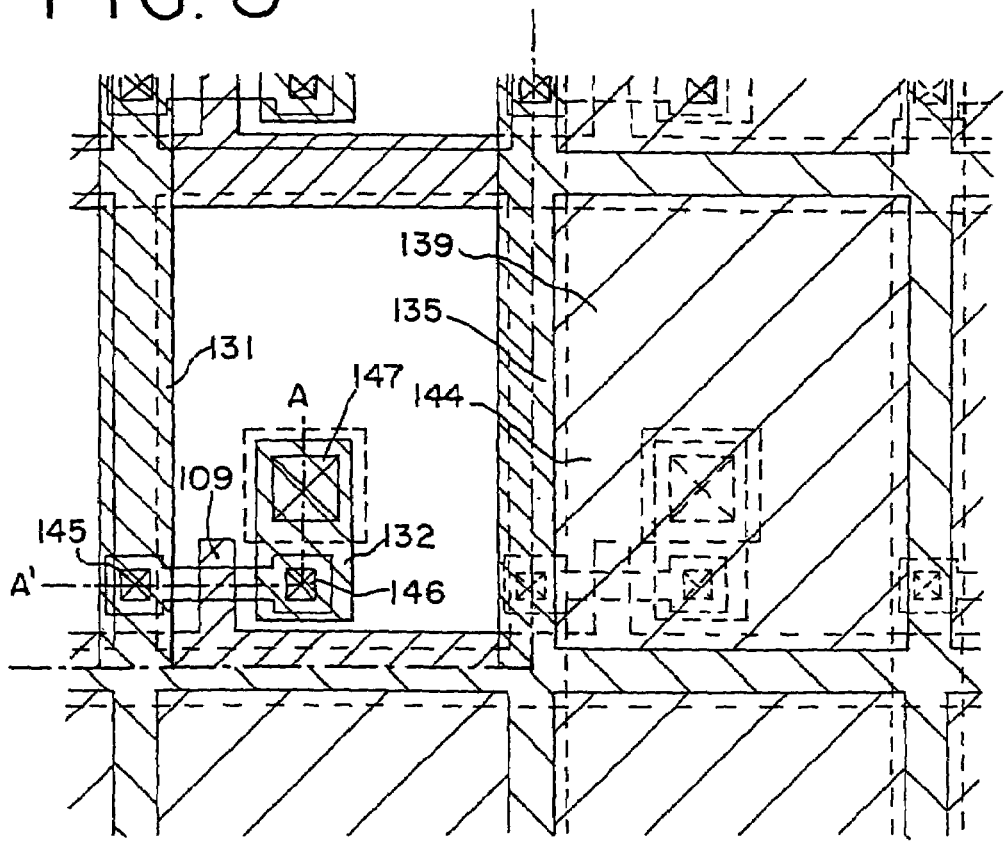
FIG. 8 is a top view of a pixel portion.

FIG. 8 is a top view showing a part of the pixel portion 701. The gate electrode 109 is formed on single crystalline silicon through agate insulating film (not-shown). Although not shown, a source wirings region and a drain region are formed in the single crystalline silicon. A light shielding film 135, a dielectric layer (not shown), and a pixel electrode 139 provided for each pixel are formed thereon, and a storage capacitance 143 is formed in the region where the light shielding film 135 overlaps with the pixel electrode 139 through the dielectric layer. Since the dielectric layer is made a dielectric film for forming the capacitance portion, it is possible to reduce an area for forming necessary capacitance. Further, when the light shielding film formed on the pixel TFT was made one of electrodes of the storage capacitance as in this embodiment, it was possible to improve an aperture ratio of a picture display portion of the active matrix type liquid crystal display device. Incidentally, a sectional structure along the line A-A' shown in FIG. 8 corresponds to a sectional view along the line A-A' of the pixel portion shown in FIG. 3.

The reflection type liquid crystal display device fabricated in this way can be used for an electro-optical device of a projection type display device, in addition to an electro-optical device of a direct viewing type display device.

Embodiment 2

In this embodiment, a description will be made on an example of an electro-optical device in which the present invention is used as a display device. A case where a reflection type display device shown in the embodiment 1 is applied to a three-plate type projection device will be described with reference to FIG. 9.

Figure 9:
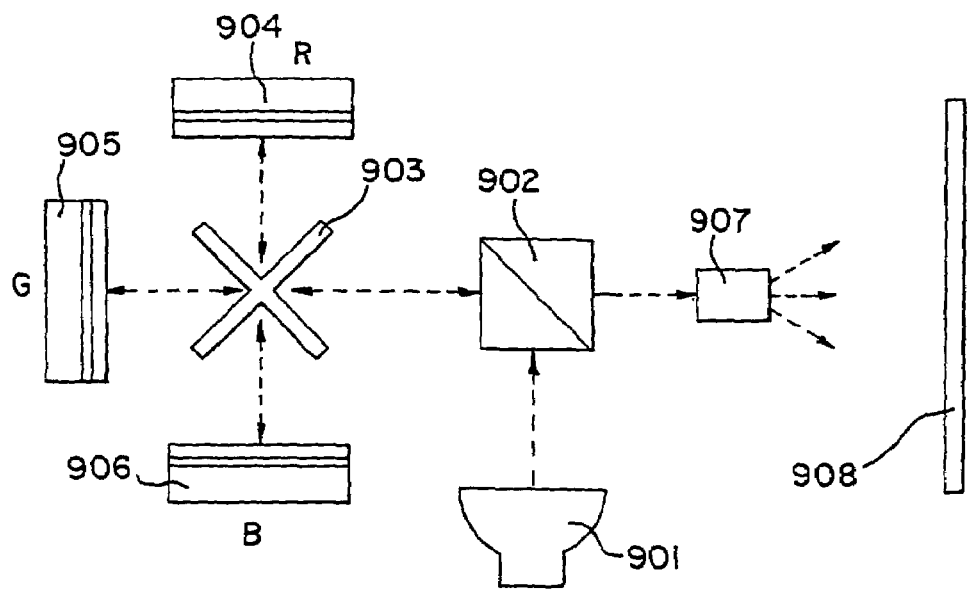
FIG. 9 is a view showing the structure of a projector using a reflection type liquid crystal display device.

In FIG. 9, light emitted from a light source 901 made of a metal halide lamp, a halogen lamp, or the like is reflected by a polarization beam splitter 902, and advances to a cross dichroic mirror 903. Incidentally, the polarization beam splitter is an optical filter having a function of reflecting or transmitting light according to the polarization direction of the light. In this case, light from the light source 901 is given such polarization that the light is reflected by the polarization beam splitter 902.

At this time, at the cross dichroic mirror 903, a red (R) component light is reflected in the direction of a liquid crystal display device 904 corresponding to red (R), and a blue (B) component light is reflected in the direction of a liquid crystal display device 906 corresponding to blue (B). A green (G) component light is transmitted through the cross dichroic mirror 903, and is incident on a liquid crystal display device 905 corresponding to green (G). In the liquid crystal display devices 904 to 906 corresponding to the respective colors, liquid crystal molecules are oriented so that when the pixel is in an off state, the polarization direction of incident light is not changed and the light is reflected. Besides, the devices are structured such that when the pixel is in an on state, the orientation state of a liquid crystal layer is changed, and the polarization direction of incident light is also changed in accordance with that.

Lights reflected by these liquid crystal display devices 904 to 906 are again reflected (green (G) component light is transmitted) by the cross dichroic mirror 903 and are synthesized, and are again incident on the polarization beam splitter 902. At this time, since the polarization direction of the light reflected by a pixel region being in the on state is changed, the light is transmitted through the polarization beam splitter 902. On the other hand, since the polarization direction of the light reflected by a pixel region being in the off state is not changed, the light is reflected by the polarization beam splitter 902. Like this, by making on/off control of the pixel regions arranged in a matrix form in the pixel portion through a plurality of transistors, only light reflected by a specified pixel region becomes possible to be transmitted through the polarization beam splitter 902. This operation is common to the respective liquid crystal display devices 904 to 906.

The light transmitted through the polarization beam splitter 902 in the manner described above and including image information is projected onto a screen 908 by an optical lens 907 constructed by projection lenses or the like. Here, although the basic structure is shown, a projection type electro-optical device can be realized by applying such a principle.

Embodiment 3

Figure 10A:
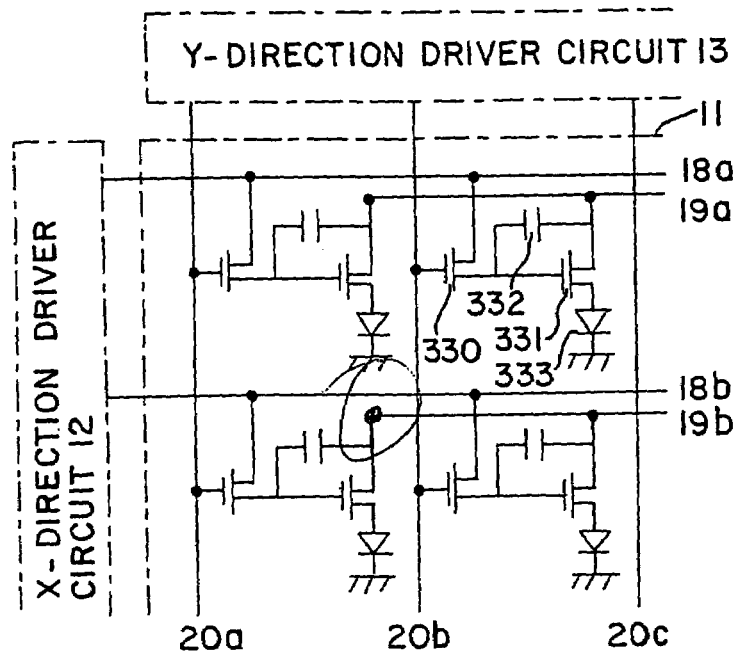
FIGS. 10A and 10B are a circuit diagram and a top view of an EL display device, respectively.

In this embodiment an example in which the present invention is applied to an active matrix type EL display device will be described with reference to FIGS. 10A and 10B and FIG. 11. FIG. 10A is a circuit diagram of the active matrix type EL display device. This EL display device is constituted by a display region 11, an X-direction peripheral driver circuit 12, and a Y-direction peripheral driver circuit 13 provided on a substrate. This display 11 is constituted by a switching transistor 330, a storage capacitance 332, a current controlling transistor 331, an organic EL component 333, X-direction signal lines 18a and 18b, power supply lines 19a and 19b, Y-direction signal lines 20a, 20b, and 20c, and the like.

Figure 10B:
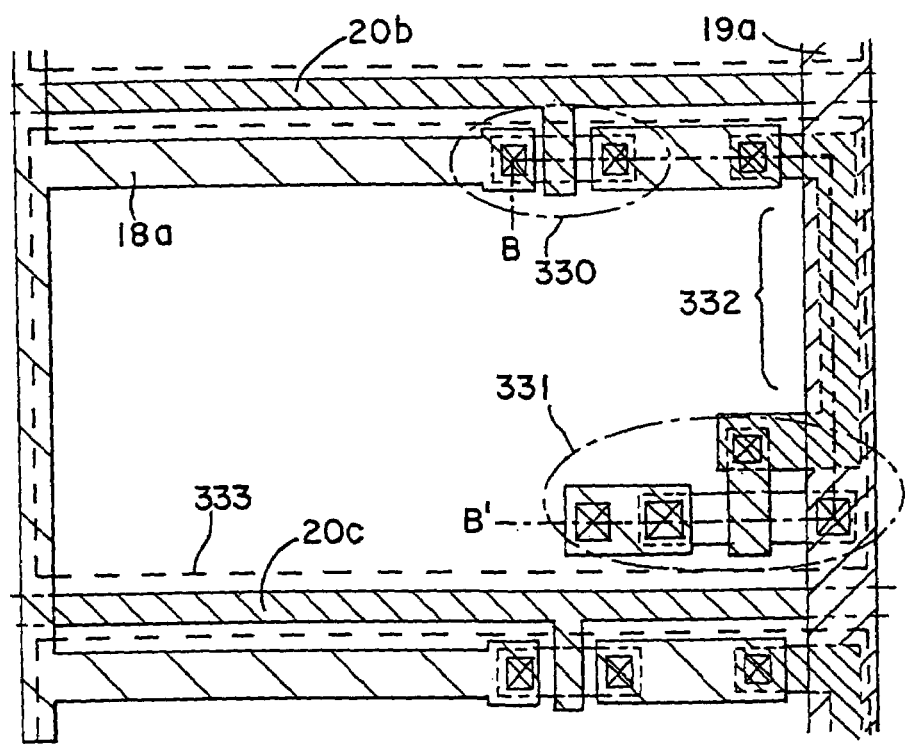
Figure 11:
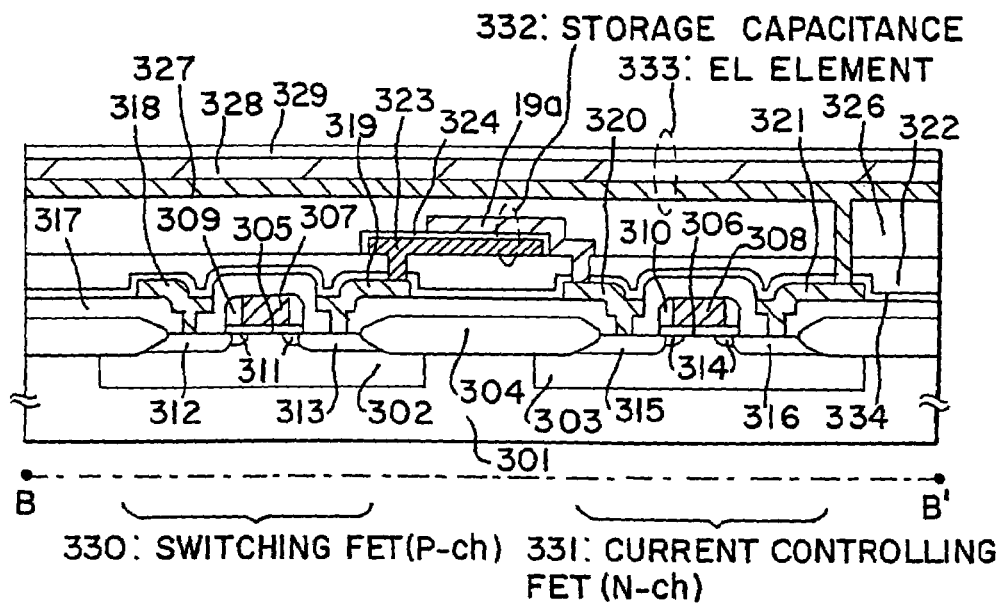
FIG. 11 is a sectional view of an EL display device.

FIG. 10B is a top view of almost one pixel. A sectional structure along the line B-B' in the drawing is shown in FIG. 11. In the sectional structure shown in FIG. 11, although a structural example using a single crystalline silicon substrate is shown, such a structure can be realized in the same way even if an SOI substrate is used. An n-well region 302 and a p-well region 303 are formed in a substrate 301, and a field oxide film 304 is formed to separate adjacent FETs. The switching FET 330 is formed of a p-channel FBI, and includes a gate insulating film 305, a gate electrode 307, a side wall 309, an LDD region 311, a source region 312, a drain region 313, a source wiring 318, and a drain wiring 319. The current controlling transistor 331 is an n-channel FET, and includes a gate insulating film 306, a gate electrode 308, a side wall 310, an LDD region 314, a source region 315, a drain region 316, a source wiring 320, and a drain wiring 321. An interlayer insulating film 317 is formed thereon. A passivation film 334 is formed on the switching FET 330 and the current controlling transistor 331. The storage capacitance 332 is formed on an interlayer insulating film 322, and is formed of a capacitance electrode 323 connected to the drain wiring 319 of the switching FET 330, a power supply line 19a, and a dielectric layer 324 provided therebetween. Here, when the capacitance electrode 323 is formed of a material containing an element selected from Al, Ta and Ti as its main ingredient, and the dielectric layer 324 is formed by anodic oxidation of its surface, an excellent storage capacitance can be formed. The organic EL component 333 is formed through an interlayer insulating film 326, and is formed of an EL component lower electrode 327 connected to the drain wiring 321 of the current controlling FET 331, an organic EL layer 328, and an EL component upper electrode 329.

Here, although the structure of the pixel region of the EL display device is shown, similarly to the embodiment 1, it is also possible to form an active matrix type display device of a peripheral circuit integration type in which a driver circuit is provided on the periphery of the pixel region. Besides, although not shown, when a color filter is provided, color display can also be made.

Embodiment 4

In this embodiment, a description will be given on a semiconductor device incorporating an active matrix liquid crystal display device made from a TFT circuit of the present invention, with reference to FIGS. 17A to 17F and FIGS. 23A and 23B. In the semiconductor device shown in FIGS. 17A to 17F and FIGS. 23A and 23B, an active matrix liquid crystal display device shown in the embodiment mode and embodiment of the present invention can be preferably employed.

As such a semiconductor device, a portable information terminal (an electronic book, a mobile computer, a cellular phone and the like), a video camera, a digital still-image camera, a personal computer, TV etc. may be enumerated. Examples of those are shown in FIGS. 17A to 17F.

Figure 17A:
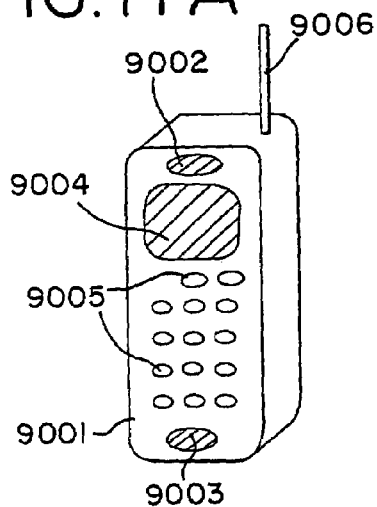
FIGS. 17A to 17F are views showing examples of semiconductor devices.

FIG. 17A is a cellular phone that is composed of a main body 9001, a sound output section 9002, a sound input section 9003, a display device 9004, operation switches 9005, and an antenna 9006. The present invention can be applied to the sound output section 9002, the sound input section 9003 and the display device 9004 having a pixel section.

Figure 17B:
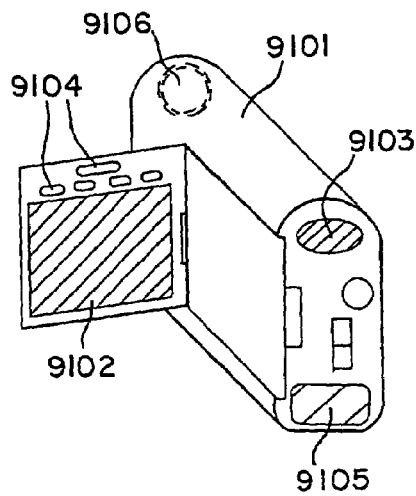

FIG. 17B shows a video camera that is comprised of a main body 9101, a display device 9102, a voice input unit 9103, operation switches 9104, a battery 9105, and an image receiving unit 9106. The present invention is applicable to the voice input unit 9103, the display device 9102 having a pixel section and the image receiving unit 9106.

Figure 17C:
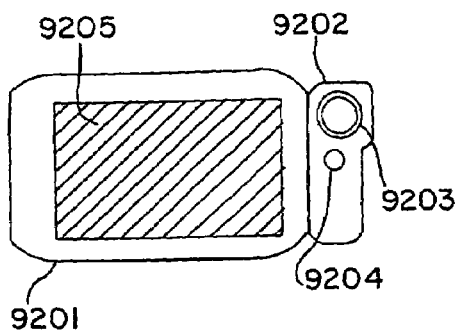

FIG. 17C shows a mobile computer that is comprised of a main body 9201, a camera unit 9202, an image receiving unit 9203, operation switches 9204, and a display device 9205. The present invention can be applied to the image receiving unit 9203 and the display device 9205 having a pixel section.

Figure 17D:
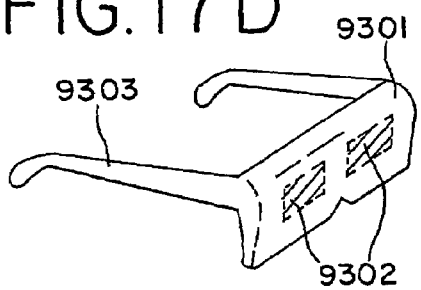

FIG. 17D shows a goggle type display that is comprised of a main body 9301, a display device 9302 and arm portions 9303. The present invention can be applied to the display device 9302. Further, although not shown, the present invention can also be used for other signal control circuits.

Figure 17E:
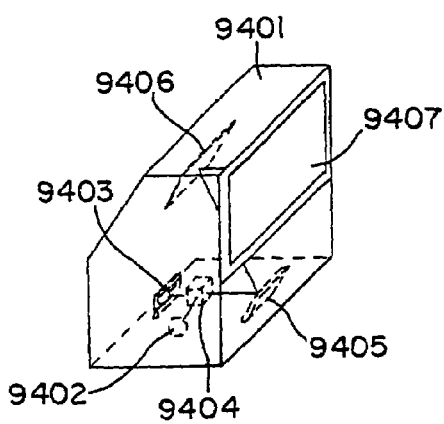

FIG. 17E shows a rear-type projector comprising a main body 9401, an optical source 9402, a display device 9403, a polarization beam splitter 9404, reflectors 9405 and 9406 and a screen 9407. The present invention is applicable to the display device 9403.

Figure 17F:
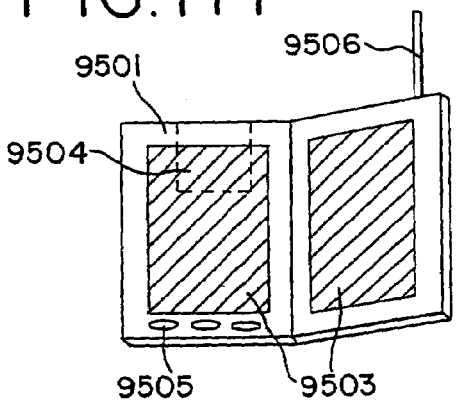

FIG. 17F shows a portable electronic book that is comprised of a main body 9501, display device 9503, a memory medium 9504, an operation switch 9505 and an antenna 9506. The book is used to display data stored in a mini-disk or a DVD, or a data received with the antenna. The display device 9503 are direct-vision type display devices, to which the present invention may be applied.

Figure 23A:
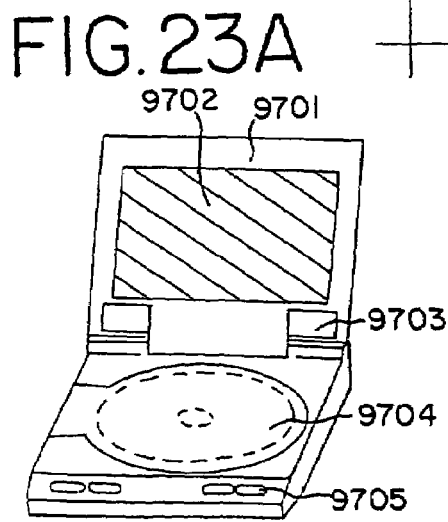
FIGS. 23A and 23B are views showing examples of semiconductor devices.

FIG. 23A shows a player that employs a recording medium in which programs are recorded (hereinafter referred to as recording medium), and comprises a main body 9701, a display device 9702, a speaker unit 9703, a recording medium 9704, and an operation switch 9705. Incidentally, this player uses as the recording medium a DVD (Digital Versatile Disc), CD and the like to appreciate music and films, play games, and connect to the Internet. The liquid crystal display device and EL display device manufactured by employing the present invention is applicable to the display device 9702.

Figure 23B:
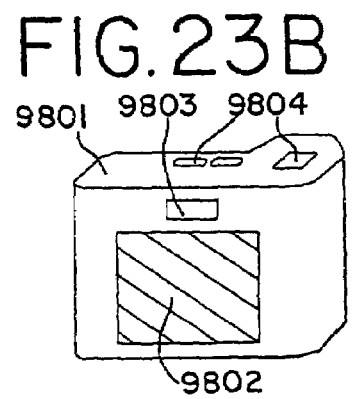
Figure 10A:
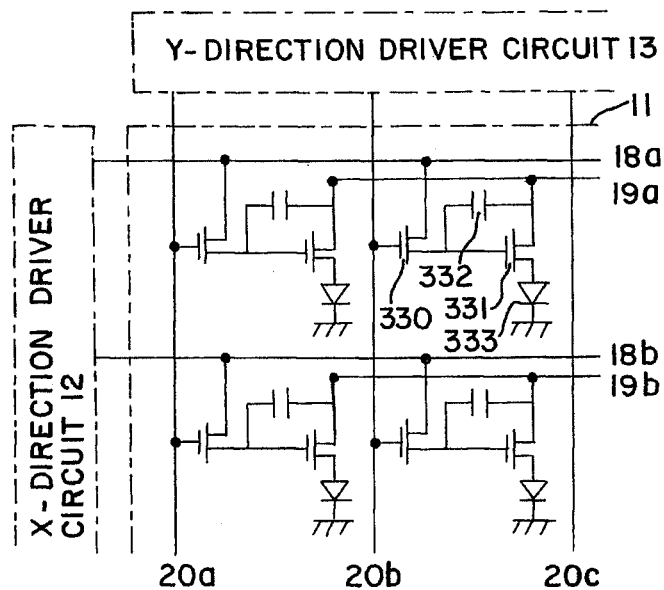
Figure 10B:
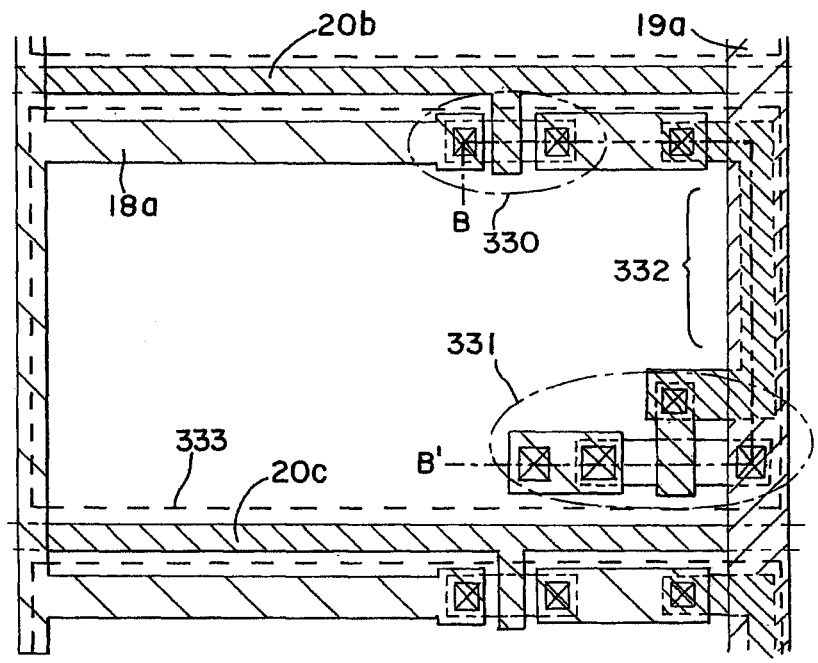

FIG. 23B shows a digital camera comprising a main body 9801, a display device 9802, an eye piece section 9803, operation switches 9804, and an image receiving unit (not shown). The liquid crystal display device and EL display device manufactured by employing the present invention is applicable to the display device 9802.

Other than those, though not shown here, the present invention may be applied to a display section of a navigation system for vehicle, an image sensor and personal computer. The present invention thus has so wide application range that it is applicable to electronic equipment in any field.

Embodiment 5

In an active matrix type display device using a single crystalline semiconductor substrate, since a manufacturing technique of an integrated circuit, such as LSI or VLSI, can be directly applied, a small-sized display device with high fineness can be fabricated. For example, even if a screen size is about 1 inch (2.56 cm in diagonal), a display device of VGA class (pixel numbers 640×480) can be realized.

However, since an area of a component, a width of a wiring, and the like become small as the degree of integration of components becomes high, in order to keep the performance of a circuit, it becomes necessary to lower the resistance of a polycrystalline silicon film used for a diffusion layer or a wiring. As one of methods for achieving this object, there is known a technique using self-aligned silicide (called salicide). This is such a method that a metal layer of titanium (Ti) or the like is formed on a substrate, and silicide is formed by a heat treatment in a self-aligning manner in a region where silicon is exposed.

In this embodiment, an example in which an active matrix type display device is fabricated by using the salicide technique will be described with reference to FIGS. 18A to 20.

In FIG. 18A, a substrate 201 similar to that of the embodiment mode 1 is used, and a n-well region 202, and p-well regions 203 and 204 are formed by one mask in a self-aligning manner. Further, a field oxide film 205 is formed. Then, a silicon oxide film 206 which becomes a gate insulating film is formed by a thermal oxidation method. Gate electrodes 207 to 209 are formed of polycrystalline silicon films in which an n-type impurity typified by phosphorus is added at a high concentrations.

Next, as shown in FIGS. 18B and 18C, in order to form lightly doped drain (LDD) regions in an n-channel FET and a p-channel FET, impurity elements which give an n-type and a p-type conductivity are added using resist masks 210 and 213 as masks. This may be carried out by an ion doping method or an ion implantation method. Phosphorus (P) is ion implanted to the n-channel FET, and boron (B) is ion implanted to the p-channel PET. A dose amount is made $1 \times 10^{13}/cm^2$. Ion implantation is carried out by using the gate electrodes as masks, so that it is possible to form, in a self-aligning manner, n-type impurity regions 211 and 212 added with phosphorus (P) in regions where the n-channel FETs are to be formed, and a p-type impurity region 215 added with boron (B) in a region where the p-channel FET is to be formed.

Thereafter, an insulating film such as a silicon oxide film or a silicon nitride film is formed on the whole surface by a CVD method, and this film is etched by anisotropic dry etching, so that side walls 216 to 218 are formed at sides of the gate electrodes 207 to 209 as shown in FIG. 19A. Then, a resist mask 219 is formed, and boron (B) is ion implanted to a region where the p-channel FET is to be formed, so that a p-type impurity 220 is formed. The p-type impurity 220 is formed to become deeper than the p-type impurity region 215 by making the acceleration voltage 50 to 100 keV.

As shown in FIG. 19B, after the resist mask 219 is removed, a metal layer 221 of Ti, Mo, Cr, or the like is formed on the whole surface. Typically, Ti is used, and the layer is formed to a thickness of 50 to 1000 nm on the whole surface by a sputtering method. Thereafter, a heat treatment is carried out at 600 to 800° C. preferably 650 to 750° C. to form titanium silicide. Titanium silicide is formed in a self-aligning manner at a portion where the Ti film is in contact with silicon, and the Ti film remaining after the heat treatment is selectively etched, so that titanium silicide layers 223 to 228 are formed on the gate electrodes formed of the polycrystalline silicon films and the p-type and n-type impurity regions as shown in FIG. 19C. However, in the titanium silicide film formed at a temperature of 800° C. or less, a high resistance phase is formed. When this film is subjected to a heat treatment at about 900° C. for about 5 to 120 seconds, a low resistance phase is formed. Although this heat treatment may be carried out in a furnace annealing, a flash lamp annealing method may be used. By forming titanium silicide, it is possible to obtain a sheet resistance of 2 to 4Ω/□ for the gate electrode and the p-type or n-type impurity region.

Then, a resist mask 229 is formed in the region where the p-channel FET is to be formed, and arsenic having a dose amount of $5 \times 10^{15}/cm^2$ is implanted at an acceleration voltage of 50 to 120 keV to the region of the n-channel FET by using the side walls and the gate electrodes as masks, so that n-type impurity regions 230 and 231 are formed. The impurity regions are also formed to become deeper than the n-type impurity regions 211 and 212.

Figure 20:
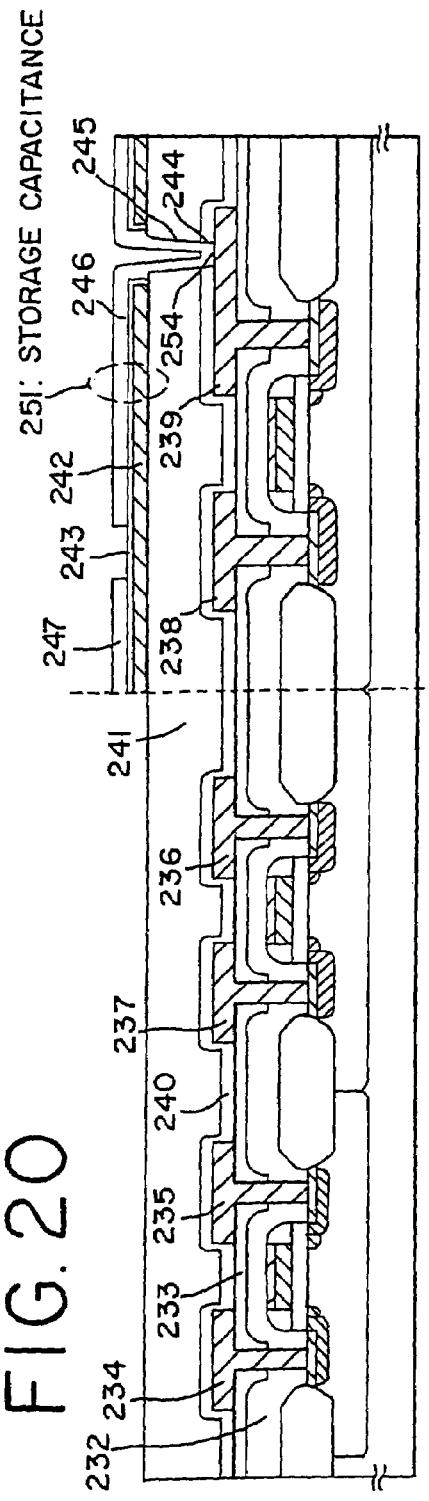
FIG. 20 is a sectional view showing a fabricating step of the pixel portion and the logic circuit.

As shown in FIG. 20, an interlayer insulating film 232 and a leveling film 233 made of phosphorus glass (PSG), boron glass (BSG), or boron phosphorus glass (BPSG) are formed. Thereafter, in order to activate the ion implanted impurity element, a heat treatment is carried out at 700 to 900° C. By this heat treatment, the leveling 223 is reflowed, so that the flatness of the surface can be improved.

Then, contact holes are formed in the interlayer insulating film 232 and the leveling film 233, and source or drain wirings 234 to 239 are formed of Al films, laminate films of Ti and Al, or the like. In this state, when a heat treatment at 300 to 5000° C. preferably 350 to 450° C. is carried out in an atmosphere containing hydrogen, characteristics of the FET can be made more preferable.

A passivation film 240 to be formed thereon is formed of a silicon nitride film, a silicon oxide film, or a silicon oxynitride film, or the like with a thickness of about 50 to 200 nm, and further, an organic resin insulating layer 241 is formed to a thickness of 1 to 2 μm. Moreover, a light shielding film 242 is formed of Al on the organic resin insulating layer 241, and its surface is oxidized by using the anodic oxidation method similarly to the embodiment mode 1 to form a dielectric layer 243. Pixel electrodes 246 and 247 are formed thereon by a light reflective material typified by Al at a contact hole 254 through openings 244 and 245.

In the manner described above, on the single crystalline silicon substrate and by using the salicide technique, it is possible to form an active matrix substrate in which a driver circuit portion including a p-channel FET 248 and an n-channel FET 249, and a pixel portion including an n-channel FET 250 and a storage capacitance 251 are formed on the same substrate. The storage capacitance is formed in the region where the light shielding film 242, the dielectric film 243, and the pixel electrode 246 overlap with one another. The oxide film formed on the surface of Al used as the light shielding film has high dielectric constant, and by forming the film to a thickness of 50 to 100 nm, even if the area of the pixel electrode per pixel is made small, capacitance necessary for driving the pixel portion can be formed. For example, even if an area of one pixel is made 400 μm², a capacitance of about 0.5 pF can be formed.

The driver circuit portion is formed by using a CMOS circuit as a base, and it is possible to form a shift register circuit, a buffer circuit, a sampling circuit, a D/A converter, a latch circuit, or the like. When such a circuit is constructed by an insulated gate FET using single crystalline silicon as an active layer, a high speed operation becomes possible, and it is also possible to decrease consumed electric power by making a driving voltage 3 to 5 V.

The p-type impurity region 215, and the n-type impurity regions 211 and 212 become LDD regions, so that it is possible to prevent deterioration of the FET due to a hot carrier effect or the like.

Besides, by using the salicide technique, the resistance of the gate wiring can be lowered, and a problem of wiring delay can be reduced. Furthermore, since the resistance of the source or drain region is lowered, the operation characteristics of the FET can be improved. By the effects as described above, the active matrix type display device having a small size and high fineness can be realized.

The structure of the transistor explained in this embodiment is merely one embodiment, and the present invention is not necessarily limited to the fabricating steps and structure shown in FIGS. 18A to 20. The important point of the present invention is the structure of the FET formed on the single crystalline substrate and the storage capacitance formed thereon through the organic resin layer.

Embodiment 6

Figure 21:
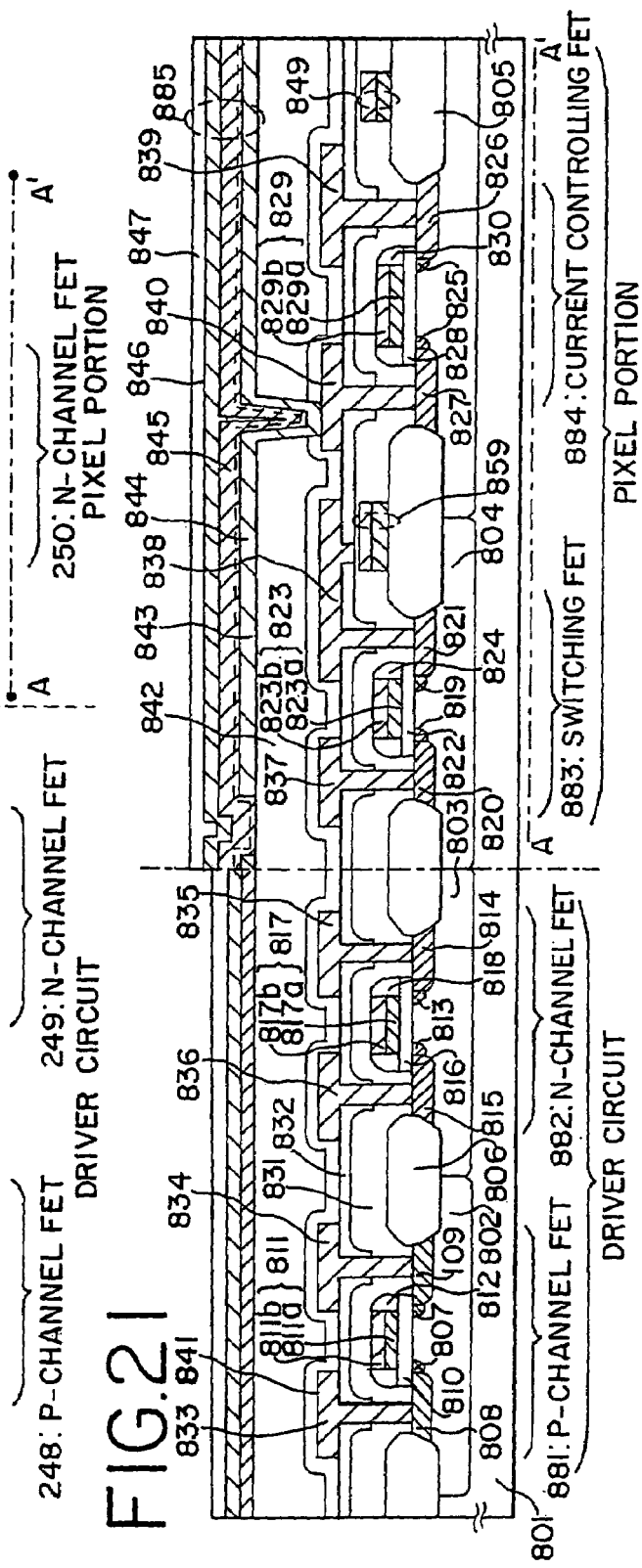
FIG. 21 is a sectional view of an active matrix type EL display device.

In this embodiment, another embodiment of an active matrix type EL display device will be described with reference to FIG. 21 and FIGS. 22A and 22B. An active matrix substrate in which a driver circuit portion and a pixel portion are formed is fabricated in the same manner as the embodiment mode 1.

A n-well 802 and p-well regions 803 to 805 are formed in a self-aligning manner in a substrate 801, and are separated by a field oxide film 806. Gate insulating films 810, 816, 822, and 828 are formed by a thermal oxidation method. Gate electrodes 811, 817, 823, and 829 are formed of polycrystalline silicon layers 811a, 817a, 823a, and 829a of polycrystalline silicon films formed to a thickness of 100 to 300 nm by a CVD method, and silicide layers 811b, 817b, 823b, and 829b formed to a thickness of 50 to 300 nm thereon. Reference numeral 849 denotes a gate wiring.

As an impurity element which gives p-type conductivity, boron (B) having a dose amount of $1 \times 10^{13}$ to $1 \times 10^{14}/cm^2$ is added into a lightly doped drain (LDD) region 807 of a p-channel FET 881. On the other hand, as an impurity element which gives n-type conductivity, phosphorus (P) or arsenic (As) is added at the same dose amount into LDD regions 813, 819, and 825 of an n-channel FET 882, a switching FET 883 formed of an n-channel FET, and a current controlling FET 884. These LDD regions are formed in a self-aligning manner by an ion implantation method or ion doping method using the gate electrodes as masks.

Side walls 812, 818, 824, and 830 are formed in such a manner that after the LDD regions are formed, an insulating film such as a silicon oxide film or a silicon nitride film is formed on the whole surface by a CVD method, this film is uniformly etched by anisotropic dry etching, and the insulating film is made to remain at the sides of the gate electrodes. A source region and a drain region of each FET are formed by using the side walls as masks. A source 808 and a drain 809 in which boron (B) with a dose amount of $5\times10^{14}$ to $1\times10^{16}/cm^2$ has been ion implanted are formed in the p-channel FET 881. Source regions 814, 820, and 826, and drain regions 815, 821, and 827 in which arsenic (As) with a dose amount of $5\times10^{14}$ to $1\times10^{16}/cm^2$ has been ion implanted are formed in the n-channel FET 882, the switching FET 883 formed of the n-channel FET, and the current controlling FET 884.

A first interlayer insulating film 831 is preferably a silicon oxide film or a silicon oxynitride film formed to a thickness of 100 to 2000 nm by a plasma CVD method or a low pressure CVD method. Further, a second interlayer insulating film 832 of phosphorus glass (PSG), boron glass (BSG), or boron phosphorus glass (BPSG) is formed thereon. The second interlayer insulating film 832 is formed by a spin coating method or a normal pressure CVD method, and by a treatment of thermal activation serving also as a heat treatment of 700 to 900° C. carried out after the formation, the second interlayer insulating film 832 is reflowed and the surface is flattened.

Source 833, 835, 837, and 839, and drain 834, 836, 838, and 840 are formed after contact holes reaching the source region and drain region of each FET are formed in the first interlayer insulating film 831 and the leveling film 832, and it is appropriate that Al normally used as a low resistance material is used. Besides, a laminate structure of Al and Ti may be used.

A passivation film 841 is formed of a silicon nitride film, a silicon oxide film, or a silicon oxynitride film by a plasma CVD method. Further, a third interlayer insulating film 842 is formed of an organic resin material with a thickness of 1 to 2 μm. A pixel electrode 843 is connected to the drain wiring of the current controlling FET 884. The pixel electrode is formed of a low resistance material typified by Al.

After the pixel electrode 843 is formed, a cathode layer 844 containing metal with low work function is formed on the whole pixel electrode. Since the film thickness is as thin as several nm, it is not apparent whether the layer is formed in a layer state or is scattered like islands. Thus, its contour is indicated by a dotted line.

As a material of the cathode layer containing metal having low work function, it is possible to use lithium fluoride (LiF), lithium oxide ($Li_2O$), barium fluoride ($BaF_2$), barium oxide (BaO), calcium fluoride ($CaF_2$), calcium oxide (CaO), strontium oxide (SrO), or cesium oxide ($Cs_2O$). Since these are insulative, even if they are formed into a layer state, a short (short circuit) between pixel electrodes is not caused. Of course, although it is also possible to use a conventional material having conductivity, such as a MgAg electrode, as the cathode layer, in order to prevent a short between the pixel electrodes, it is necessary to selectively provide the cathode itself or to carry out patterning.

An organic EL layer (electroluminescence layer) 845 is formed on the cathode 844 containing the metal of the low work function. Although a conventional material and a structure may be used for the organic EL layer 845, in the present invention, a material capable of emitting white light is used. As the structure, only a light emitting layer to provide a field of recombination may be made the organic EL layer, or as the need arises, an electron injection layer, an electron transport layer, a hole transport layer, an electron blocking layer, a hole blocking layer, or a hole injection layer may be laminated. In the present specification, the organic EL layer includes any layers where injection, transportation, or recombination of carriers is carried out.

As an organic EL material used for the organic EL layer 845, a polymer high molecular organic EL material is used. The organic EL layer 845 is formed in such a manner that PVK (polyvinyl carbazole), Bu-PBD (2-(4'-tert-butylphenyl)-5-(4''-biphenyl)-1,3,4-oxadiazol), coumarin 6, DCMI (4-dicyanomethylene-2-methyl-6-p-dimethylaminostyryl-4H-pyran), TPB (tetraphenylbutadiene), or Nile red is dissolved in 1,2-dichloromethane or chloroform, and is applied by a spin coating method. The number of revolutions is made about 500 to 1000 rpm, and revolution is made for 20 to 60 seconds so that a uniform coating film is formed.

Of course, the organic EL material is subjected to refining (typically, dialysis) at least three times, preferably five times or more, so that the concentration of contained sodium is made 0.1 ppm or less preferably 0.01 ppm or less), and then, film formation is made. By doing so, the concentration of sodium contained in the organic EL layer 845 shown in FIG. 21 becomes 0.1 ppm or less (preferably 0.01 ppm or less), and a volume resistance value becomes $1\times10^{11}$ to $1\times10^{12}$ Ωcm (preferably $1\times10^{12}$ to $1\times10^{13}$ Ωcm).

A transparent conductive film as an anode layer 846 is formed on the thus formed organic EL layer 845. As the transparent conductive film, it is possible to use a compound (called ITO) of indium oxide and tin oxide, a compound of indium oxide and zinc oxide, tin oxide ($SnO_2$), or zinc oxide (ZnO), or the like.

An insulating film as a passivation film 847 is formed on the anode layer 846. As the passivation film 847, it is preferable to use a silicon nitride film or a silicon oxynitride film (expressed by SiOxNy).

Figure 22A:
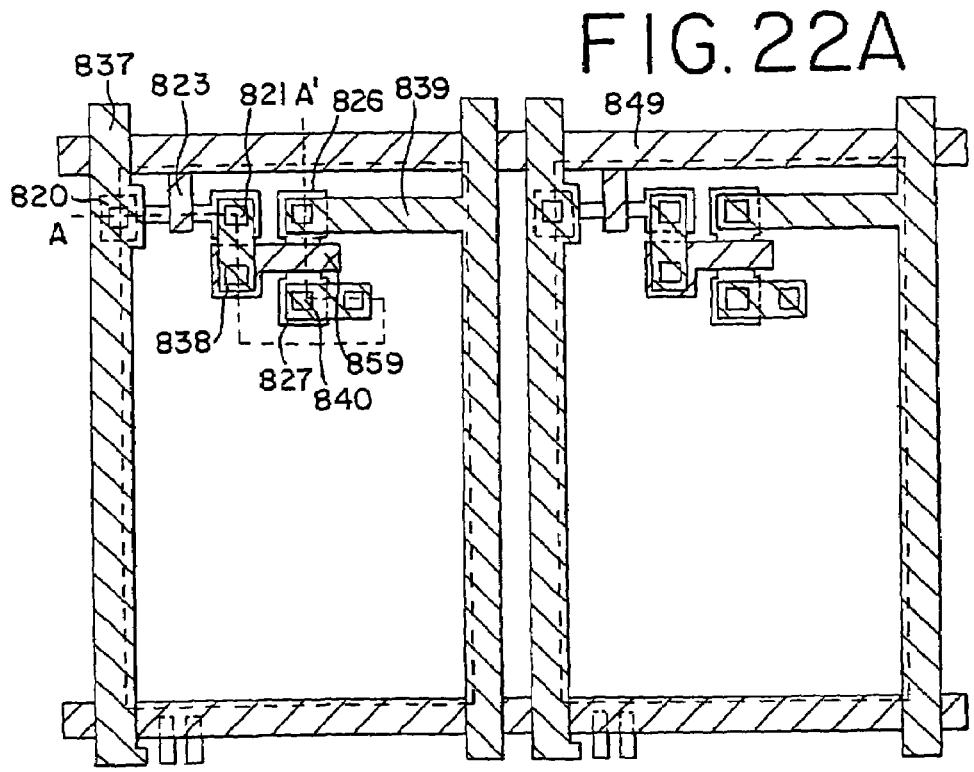
FIGS. 22A and 22B are a top view and a circuit diagram of a pixel portion of an EL display device.
Figure 22B:
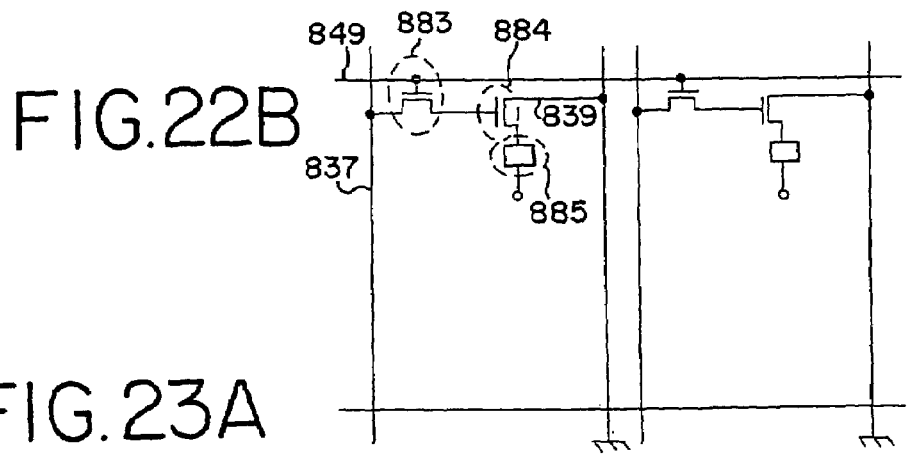

FIG. 22A is a top view of a pixel portion of an active matrix type EL display device, and FIG. 22B is a view showing its circuit structure. Actually, a plurality of pixels are arranged in a matrix form so that the pixel portion (picture display portion) is formed. Incidentally, a sectional view taken along the line A-A' of FIG. 22A corresponds to a sectional view of the pixel portion of FIG. 21. Thus, since common numerals are used in FIGS. 21 and 22A, reference may be suitably made to both the drawings. Although the top view of FIG. 22A shows two pixels, both have the same structure. As shown in FIG. 22B, in an organic EL component 885, two FETs are provided per pixel. Both are n-channel FETs, and function as the switching FET 883 and the current controlling FET 884.

In the manner as described above, it is possible to form the driver circuit including, as a base, the CMOS circuit made of the p-channel FET 881 and the n-channel FET 882, and the pixel portion including the switching FET 883 and the current controlling FET 884, which are formed of the n-channel FETs, on the single crystalline silicon substrate. With respect to the driver circuit including the CMOS circuit as the base, for example, a shift register circuit, a buffer circuit, a sampling circuit, a D/A converter, a latch circuit, or the like is formed using the CMOS circuit as the base. When such a circuit is formed of an insulated gate FET using single crystalline silicon as an active layer, a high speed operation becomes possible, and it is also possible to decrease consumed electric power by making a driving voltage 3 to 5 V. Incidentally, the structure of the FET explained in this embodiment is merely one embodiment, and the present invention is not necessarily limited to the structure shown in FIG. 21.

Typical effects obtained in the present invention will be explained below in brief.

In an active matrix substrate in which by means of FETs using single crystalline semiconductor typified by single crystalline silicon as an active layer, a pixel portion and a driver circuit connected to the pixel portion are provided on the same substrate, an organic resin insulating layer is formed on the FET, and a storage capacitance is formed of a light shielding film formed thereon, a dielectric layer formed to be in close contact with the light shielding film, and a pixel electrode formed so that its part overlaps with the light shielding film. Thus, it is possible to form a display device being capable of operating at high speed, with low consumed electric power and high reliability.

Such an active matrix substrate can be suitably used for a liquid crystal display device using thresholdless antiferroelectric mixed liquid crystal.

In the above display device, by forming the dielectric layer to be in close contact with the light shielding film by means of an anodic oxidation method, it becomes possible to form the excellent dielectric layer without defects such as a pinhole. Moreover, by uniformly and thinly forming the dielectric layer having high dielectric constant by means of the anodic oxidation method, sufficient storage capacitance can be secured even if a pixel pitch is shortened.

In the method of forming the dielectric layer to be in close contact with the light shielding film provided on the organic resin insulating layer by means of the anodic oxidation method, when the control pattern of formation voltage and formation current shown in FIG. 13B is adopted, it is possible to form the dielectric layer in which soaking from the end does not occur. By forming the storage capacitance with the thus fabricated dielectric layer, the display device having high reliability can be realized.

What is claimed is:

1. A semiconductor device comprising:
   a substrate;
   an insulating layer on the substrate;
   a transistor on the insulating layer, the transistor comprising a single crystalline semiconductor layer including a source region, a drain region and a channel region between the source region and the drain region, a gate insulating film formed over the channel region and a gate electrode formed over the gate insulating film;
   a leveling film over the transistor;
   a source wiring and a drain wiring over the leveling film, the source wiring being electrically connected with the source region and the drain wiring being electrically connected with the drain region;
   a storage capacitance over the source wiring and the drain wiring, the storage capacitance comprising a first electrode, an insulating film and a second electrode;
   an interlayer insulating film over the storage capacitance;
   a third electrode containing a metal over the interlayer insulating film;
   an EL layer over the third electrode; and
   a fourth electrode which is a transparent conductive film over the EL layer, and
   wherein one of the source wiring and the drain wiring is electrically connected to the third electrode, and
   wherein the other of the source wiring and the drain wiring is electrically connected to the storage capacitance.

2. A semiconductor device according to claim 1, wherein the leveling film comprises one selected from the group consisting of PSG, BSG, and BPSG.

3. A semiconductor device according to claim 1, wherein the second electrode is overlapped with the first electrode.

4. A semiconductor device according to claim 1, wherein the first electrode comprises one selected from the group consisting of Al, Ta and Ti.

5. A semiconductor device according to claim 1, wherein the second electrode comprises Al.

6. A semiconductor device according to claim 1, wherein the insulating film comprises an oxidation film of the first electrode.

7. A semiconductor device according to claim 1, wherein the semiconductor device is incorporated in at least one selected from the group consisting of a portable telephone, a video camera, a mobile computer, a goggle type display, a projector, an electronic book, a digital camera, and a DVD player.

8. A semiconductor device according to claim 1, wherein the substrate is a semiconductor substrate.

9. A semiconductor device according to claim 1, wherein a top surface and a side surface of the second electrode is covered with the interlayer insulating film.

10. A semiconductor device comprising:
    a substrate;
    an insulating layer on the substrate;
    a transistor on the insulating layer, the transistor comprising a single crystalline semiconductor layer including a source region, a drain region and a channel region between the source region and the drain region, a gate insulating film formed over the channel region and a gate electrode formed over the gate insulating film;
    a leveling film over the transistor;
    a source wiring and a drain wiring over the leveling film, the source wiring being electrically connected with the source region and the drain wiring being electrically connected with the drain region;
    a first interlayer insulating film over the source wiring and the drain wiring;
    a storage capacitance over the first interlayer insulating film, the storage capacitance comprising a first electrode, an insulating film and a second electrode;
    a second interlayer insulating film over the storage capacitance;
    a third electrode containing a metal over the second interlayer insulating film;
    an EL layer over the third electrode; and
    a fourth electrode which is a transparent conductive film over the EL layer, and
    wherein one of the source wiring and the drain wiring is electrically connected to the third electrode, and
    wherein the other of the source wiring and the drain wiring is electrically connected to the storage capacitance.

11. A semiconductor device according to claim 10, wherein the leveling film comprises one selected from the group consisting of PSG, BSG, and BPSG.

12. A semiconductor device according to claim 10 wherein the second electrode is overlapped with the first electrode.

13. A semiconductor device according to claim 10, wherein the first electrode comprises one selected from the group consisting of Al, Ta and Ti.

14. A semiconductor device according to claim 10, wherein the second electrode comprises Al.

15. A semiconductor device according to claim 10, wherein the insulating film comprises an oxidation film of the first electrode.

16. A semiconductor device according to claim 10, wherein the semiconductor device is incorporated in at least one selected from the group consisting of a portable telephone, a video camera, a mobile computer, a goggle type display, a projector, an electronic book, a digital camera, and a DVD player.

17. A semiconductor device according to claim 10, wherein the second electrode is electrically connected with the drain wiring.

18. A semiconductor device according to claim 10, wherein the first interlayer insulating film is an organic resin insulating film.

19. A semiconductor device according to claim 10, wherein the substrate is a semiconductor substrate.

20. A semiconductor device according to claim 10,
wherein a top surface and a side surface of the second electrode is covered with the second interlayer insulating film.

21. A semiconductor device comprising:
a substrate;
an insulating layer on the substrate;
a transistor on the insulating layer, the transistor comprising a single crystalline semiconductor layer including a source region, a drain region, an LDD region, and a channel region between the source region and the drain region, a gate insulating film formed over the channel region and a gate electrode formed over the gate insulating film;
a leveling film over the transistor;
a source wiring and a drain wiring over the leveling film, the source wiring being electrically connected with the source region and the drain wiring being electrically connected with the drain region;
a storage capacitance over the leveling-film source wiring and the drain wiring, the storage capacitance comprising a first electrode, an insulating film and a second electrode;
an interlayer insulating film over the storage capacitance;
a third electrode containing a metal over the interlayer insulating film;
an EL layer over the third electrode; and
a fourth electrode which is a transparent conductive film over the EL layer, and
wherein one of the source wiring and the drain wiring is electrically connected to the third electrode, and
wherein the other of the source wiring and the drain wiring is electrically connected to the storage capacitance.

22. A semiconductor device according to claim 21, wherein the leveling film comprises one selected from the group consisting of PSG, BSG, and BPSG.

23. A semiconductor device according to claim 21, wherein the second electrode is overlapped with the first electrode.

24. A semiconductor device according to claim 21, wherein the first electrode comprises one selected from the group consisting of Al, Ta and Ti.

25. A semiconductor device according to claim 21, wherein the second electrode comprises Al.

26. A semiconductor device according to claim 21, wherein the insulating film comprises an oxidation film of the first electrode.

27. A semiconductor device according to claim 21, wherein the semiconductor device is incorporated in at least one selected from the group consisting of a portable telephone, a video camera, a mobile computer, a goggle type display, a projector, an electronic book, a digital camera, and a DVD player.

28. A semiconductor device according to claim 21, wherein the substrate is a semiconductor substrate.

29. A semiconductor device according to claim 21,
wherein a top surface and a side surface of the second electrode is covered with the interlayer insulating film.

30. A semiconductor device comprising:
a substrate;
an insulating layer on the substrate;
a transistor on the insulating layer, the transistor comprising a single crystalline semiconductor layer including a source region, a drain region, an LDD region, and a channel region between the source region and the drain region, a gate insulating film formed over the channel region and a gate electrode formed over the gate insulating film;
a leveling film over the transistor;
a source wiring and a drain wiring over the leveling film, the source wiring being electrically connected with the source region and the drain wiring being electrically connected with the drain region;
a first interlayer insulating film over the source wiring and the drain wiring;
a storage capacitance over the first interlayer insulating film, the storage capacitance comprising a first electrode, an insulating film and a second electrode;
a second interlayer insulating film over the storage capacitance;
a third electrode containing a metal over the second interlayer insulating film;
an EL layer over the third electrode; and
a fourth electrode which is a transparent conductive film over the EL layer, and
wherein one of the source wiring and the drain wiring is electrically connected to the third electrode, and
wherein the other of the source wiring and the drain wiring is electrically connected to the storage capacitance.

31. A semiconductor device according to claim 30, wherein the leveling film comprises one selected from the group consisting of PSG, BSG, and BPSG.

32. A semiconductor device according to claim 30, wherein the second electrode is overlapped with the first electrode.

33. A semiconductor device according to claim 30, wherein the first electrode comprises one selected from the group consisting of Al, Ta and Ti.

34. A semiconductor device according to claim 30, wherein the second electrode comprises Al.

35. A semiconductor device according to claim 30, wherein the insulating film comprises an oxidation film of the first electrode.

36. A semiconductor device according to claim 30, wherein the semiconductor device is incorporated in at least one selected from the group consisting of a portable telephone, a video camera, a mobile computer, a goggle type display, a projector, an electronic book, a digital camera, and a DVD player.

37. A semiconductor device according to claim 30, wherein the second electrode is electrically connected with the drain wiring.

38. A semiconductor device according to claim 30, wherein the first interlayer insulating film is an organic resin insulating film.

39. A semiconductor device according to claim 30, wherein the substrate is a semiconductor substrate.

40. A semiconductor device according to claim 30,
wherein a top surface and a side surface of the second electrode is covered with the second interlayer insulating film.

41. A semiconductor device comprising:
a substrate;
an insulating layer on the substrate;
a transistor on the insulating layer, the transistor comprising a single crystalline semiconductor layer including a source region, a drain region and a channel region between the source region and the drain region, a gate insulating film formed over the channel region and a gate electrode formed over the gate insulating film;

a field insulating film adjacent to the single crystalline semiconductor layer and over the insulating layer;

a source wiring and a drain wiring over the transistor and the field insulating film, the source wiring being electrically connected with the source region and the drain wiring being electrically connected with the drain region;

a storage capacitance over the source wiring and the drain wiring, the storage capacitance comprising a first electrode, an insulating film and a second electrode;

an interlayer insulating film over the storage capacitance;

a third electrode over the interlayer insulating film;

an EL layer over the third electrode; and a forth electrode which is a transparent conductive film over the EL layer, and wherein one of the source wiring and the drain wiring is electrically connected to the third electrode, and wherein the other of the source wiring and the drain wiring is electrically connected to the storage capacitance.

42. A semiconductor device according to claim 41, wherein the substrate is a semiconductor substrate.

43. A semiconductor device according to claim 41, wherein the semiconductor device is incorporated in at least one selected from the group consisting of a portable telephone, a video camera, a mobile computer, a goggle type display, a projector, an electronic book, a digital camera, and a DVD player.

44. A semiconductor device according to claim 41, further comprising a leveling film over the transistor.

45. A semiconductor device according to claim 41, further comprising a side wall on a side surface of the gate electrode.

46. A semiconductor device according to claim 41, wherein a top surface and a side surface of the second electrode is covered with the interlayer insulating film.

47. A semiconductor device comprising:

a substrate;

an insulating layer on the substrate;

a first transistor and a second transistor on the insulating layer, each of the first transistor and the second transistor comprising a single crystalline semiconductor layer including a source region, a drain region and a channel region between the source region and the drain region, a gate insulating film formed over the channel region and a gate electrode formed over the gate insulating film;

a field insulating film between the first transistor and the second transistor and over the insulating layer;

a source wiring and a drain wiring over the first transistor, the second transistor and the field insulating film, the source wiring being electrically connected with the source region and the drain wiring being electrically connected with the drain region;

a storage capacitance over the source wiring and the drain wiring, the storage capacitance comprising a first electrode, an insulating film and a second electrode;

an interlayer insulating film over the storage capacitance;

a third electrode over the interlayer insulating film;

an EL layer over the third electrode; and a forth electrode which is a transparent conductive film over the EL layer, and wherein one of the source wiring and the drain wiring is electrically connected to the third electrode, and wherein the other of the source wiring and the drain wiring is electrically connected to the storage capacitance.

48. A semiconductor device according to claim 47, wherein the substrate is a semiconductor substrate.

49. A semiconductor device according to claim 47, wherein the semiconductor device is incorporated in at least one selected from the group consisting of a portable telephone, a video camera, a mobile computer, a goggle type display, a projector, an electronic book, a digital camera, and a DVD player.

50. A semiconductor device according to claim 47, further comprising a leveling film over the first transistor and the second transistor.

51. A semiconductor device according to claim 47, further comprising a side wall on a side surface of the gate electrode.

52. A semiconductor device according to claim 47, wherein a top surface and a side surface of the second electrode is covered with the interlayer insulating film.

* * * * *

UNITED STATES PATENT AND TRADEMARK OFFICE
CERTIFICATE OF CORRECTION

| | | |
|---|---|---|
| PATENT NO. | : 7,723,725 B2 | |
| APPLICATION NO. | : 11/649315 | |
| DATED | : May 25, 2010 | |
| INVENTOR(S) | : Shunpei Yamazaki, Satoshi Murakami and Yasuyuki Arai | |

It is certified that error appears in the above-identified patent and that said Letters Patent is hereby corrected as shown below:

In The Drawings:

Delete sheet 7 of 16, and replace with attached sheet consisting of Fig. 10A and 10B.

In The Specification:

Column 1, Line 43, delete ";" and insert -- , --;

Column 1, Line 54, change "TET;" to -- TFT --;

Column 1, Line 60, after "EL," delete ",";

Column 2, Line 39, after "for," delete ",";

Column 3, Lines 1-2, after "semiconductor;" delete ";" and insert -- , --;

Column 3, Line 11, change "semiconductors" to -- semiconductor --;

Column 3, Line 34, after "layer," delete ",";

Column 3, Line 36, after "steps of" insert -- : --;

Column 5, Line 33, change "methods" to -- method --;

Column 5, Line 51, after "Thereafter;" delete ";" and insert -- , --;

Column 5, Line 60, after "Moreover;" delete ";" and insert -- , --;

Column 7, Line 57, change "FIG. 3A" to -- FIG. 13A --.

Signed and Sealed this
Fifteenth Day of February, 2011

David J. Kappos
*Director of the United States Patent and Trademark Office*

In The Specification:

Column 8, Line 38, change "voltages" to -- voltage --;

Column 8, Table 2, Line 4, under "Anodic Oxidation Time" change "328" to -- 128 --;

Column 10, Line 11, change "methods" to -- method --;

Column 11, Line 31, change "pie-tilt" to -- pre-tilt --;

Column 11, Line 49, change "67.3" to -- 673 --;

Column 13, Line 4, after "source" delete "wirings";

Column 13, Line 14, after "source" delete "wirings";

Column 14, Line 46, change "FBI" to -- FET --;

Column 16, Line 46, change "concentrations" to -- concentration --;

Column 16, Line 54, change "PET" to -- FET --;

Column 20, Line 5, change "DCMI" to -- DCM1 --;

In The Claims:

Column 23, Claim 21, Line 25, delete "leveling-film".